(12) United States Patent
Zhang et al.

(10) Patent No.: US 7,635,895 B2
(45) Date of Patent: Dec. 22, 2009

(54) DISPLAY DEVICE

(75) Inventors: Hongyong Zhang, Yamato (JP);
Yasuhiko Takemura, Ohtsu (JP);
Toshimitsu Konuma, Atsugi (JP);
Hideto Ohnuma, Atsugi (JP); Naoaki Yamaguchi, Yokohama (JP); Hideomi Suzawa, Atsugi (JP); Hideki Uochi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/647,179

(22) Filed: Dec. 29, 2006

(65) Prior Publication Data
US 2007/0138473 A1    Jun. 21, 2007

Related U.S. Application Data

(62) Division of application No. 11/137,513, filed on May 26, 2005, now Pat. No. 7,183,614, which is a division of application No. 09/526,486, filed on Mar. 15, 2000, now Pat. No. 6,906,383, which is a division of application No. 08/922,363, filed on Sep. 3, 1997, now Pat. No. 6,773,971, which is a division of application No. 08/502,100, filed on Jul. 12, 1995, now abandoned.

(30) Foreign Application Priority Data

Jul. 14, 1994   (JP)  ...................... 6-186264
Jul. 26, 1994   (JP)  ...................... 6-195843

(51) Int. Cl.
*H01L 27/12*    (2006.01)
(52) U.S. Cl. .............................. 257/347; 257/E27.112
(58) Field of Classification Search ................ 257/213, 257/288, 347, 348, 349, 350, 351, 352, 353, 257/354, E27.111, E27.112
See application file for complete search history.

(56) References Cited

U.S. PATENT DOCUMENTS 4,704,002 A    11/1987   Kikuchi et al.
(Continued)

FOREIGN PATENT DOCUMENTS

EP    0 487 220    5/1992
(Continued)

OTHER PUBLICATIONS

Streetman, "Solid State Electronic Devices," 1990, Prentice Hall, 3rd ed., p. 325-327.*
(Continued)

*Primary Examiner*—Sue Purvis
*Assistant Examiner*—Kevin Quinto
(74) *Attorney, Agent, or Firm*—Eric J. Robinson; Robinson Intellectual Property Law Office, P.C.

(57) ABSTRACT

There is provided a method by which lightly doped drain (LDD) regions can be formed easily and at good yields in source/drain regions in thin film transistors possessing gate electrodes covered with an oxide covering. A lightly doped drain (LDD) region is formed by introducing an impurity into an island-shaped silicon film in a self-aligning manner, with a gate electrode serving as a mask. First, low-concentration impurity regions are formed in the island-shaped silicon film by using rotation-tilt ion implantation to effect ion doping from an oblique direction relative to the substrate. Low-concentration impurity regions are also formed below the gate electrode at this time. After that, an impurity at a high concentration is introduced normally to the substrate, so forming high-concentration impurity regions. In the above process, a low-concentration impurity region remains below the gate electrode and constitutes a lightly doped drain region.

30 Claims, 15 Drawing Sheets

U.S. PATENT DOCUMENTS

| | | | |
|---|---|---|---|
| 4,965,213 A | 10/1990 | Blake | |
| 5,051,570 A | 9/1991 | Tsujikawa et al. | |
| 5,146,291 A | 9/1992 | Watabe et al. | |
| 5,147,826 A | 9/1992 | Liu et al. | |
| 5,165,075 A | 11/1992 | Hiroki et al. | |
| 5,217,910 A | 6/1993 | Shimizu et al. | |
| 5,217,913 A | 6/1993 | Watabe et al. | |
| 5,243,213 A * | 9/1993 | Miyazawa et al. | 257/350 |
| 5,275,851 A | 1/1994 | Fonash et al. | |
| 5,287,205 A | 2/1994 | Yamazaki et al. | |
| 5,289,030 A | 2/1994 | Yamazaki et al. | |
| 5,292,675 A | 3/1994 | Codama | |
| 5,308,780 A | 5/1994 | Chou et al. | |
| 5,308,998 A | 5/1994 | Yamazaki et al. | |
| 5,323,042 A | 6/1994 | Matsumoto | |
| 5,359,219 A | 10/1994 | Hwang | |
| 5,366,915 A | 11/1994 | Kodama | |
| 5,396,084 A | 3/1995 | Matsumoto | |
| 5,413,945 A | 5/1995 | Chien et al. | |
| 5,444,022 A * | 8/1995 | Gardner | 438/627 |
| 5,444,282 A | 8/1995 | Yamaguchi et al. | |
| 5,516,711 A | 5/1996 | Wang | |
| 5,523,257 A | 6/1996 | Yamazaki et al. | |
| 5,532,176 A | 7/1996 | Katada et al. | |
| 5,547,883 A | 8/1996 | Kim | |
| 5,591,650 A | 1/1997 | Hsu et al. | |
| 5,610,089 A | 3/1997 | Iwai et al. | |
| 5,614,432 A | 3/1997 | Goto | |
| 5,624,868 A * | 4/1997 | Iyer | 438/762 |
| 5,648,277 A | 7/1997 | Zhang et al. | |
| 5,650,338 A | 7/1997 | Yamazaki et al. | |
| 5,677,224 A | 10/1997 | Kadosh et al. | |
| 5,710,451 A | 1/1998 | Merchant | |
| 5,712,495 A | 1/1998 | Suzawa | |
| 5,736,750 A | 4/1998 | Yamazaki et al. | |
| 5,739,549 A | 4/1998 | Takemura et al. | |
| 5,764,321 A | 6/1998 | Koyama et al. | |
| 5,767,930 A | 6/1998 | Kobayashi et al. | |
| 5,773,347 A | 6/1998 | Kimura et al. | |
| 5,804,472 A | 9/1998 | Balasinski et al. | |
| 5,827,747 A | 10/1998 | Wang et al. | |
| 5,841,170 A | 11/1998 | Adan et al. | |
| 5,889,291 A | 3/1999 | Koyama et al. | |
| 5,891,766 A | 4/1999 | Yamazaki et al. | |
| 5,913,112 A | 6/1999 | Yamazaki et al. | |
| RE36,314 E | 9/1999 | Yamazaki et al. | |
| 5,962,870 A | 10/1999 | Yamazaki et al. | |
| 6,013,928 A | 1/2000 | Yamazaki et al. | |
| 6,100,561 A | 8/2000 | Wang et al. | |
| 6,114,728 A | 9/2000 | Yamazaki et al. | |
| 6,198,133 B1 * | 3/2001 | Yamazaki et al. | 257/347 |
| 6,222,238 B1 | 4/2001 | Chang et al. | |
| 6,388,291 B1 | 5/2002 | Zhang et al. | |
| 6,417,543 B1 | 7/2002 | Yamazaki et al. | |
| 6,433,361 B1 | 8/2002 | Zhang et al. | |
| 6,492,681 B2 | 12/2002 | Koyama et al. | |
| 6,507,069 B1 | 1/2003 | Zhang et al. | |
| 6,566,711 B1 | 5/2003 | Yamazaki et al. | |
| 6,608,353 B2 | 8/2003 | Miyazaki et al. | |
| 6,773,971 B1 | 8/2004 | Zhang et al. | |

FOREIGN PATENT DOCUMENTS

| | | |
|---|---|---|
| JP | 58-142566 | 8/1983 |
| JP | 63-313814 | 12/1988 |
| JP | 01-307266 | 12/1989 |
| JP | 02-148865 | 6/1990 |
| JP | 02-153538 | 6/1990 |
| JP | 03-024735 | 2/1991 |
| JP | 03-203322 | 9/1991 |
| JP | 03-283626 | 12/1991 |
| JP | 04-188633 | 7/1992 |
| JP | 04-253342 | 9/1992 |
| JP | 04-320036 | 11/1992 |
| JP | 05-114724 | 5/1993 |
| JP | 05-121433 | 5/1993 |
| JP | 05-142577 | 6/1993 |
| JP | 05-235360 A * | 9/1993 |
| JP | 05-241201 | 9/1993 |
| JP | 05-315355 | 11/1993 |
| JP | 07-106337 | 4/1995 |

OTHER PUBLICATIONS

Wolf, "Silicon Processing for the VLSI Era, vol. 2—Process Integration," 1990, Lattice Press, p. 194-196.*

A. V. Dvurechenskii et al., "Transport Phenomena in Amorphous Silicon Doped by Ion Implantation of 3d Metals," Akademikian Lavrentev Prospekt 13. 630090 Novosibirsk 90, USSR, Phys. Stat. Sol., vol. 95, 1986, pp. 635-640.

T. Hempel et al., "Needle-Like Crystallization of Ni Doped Amorphous Silicon Thin Films," Solid State Communications, vol. 85, No. 11, pp. 921-924, 1993.

Wolf, Silicon Processing for the VLSI Era, vol. 2—Process Integration, Lattice Press, 1990, pp. 66-67.

Wolf et al., Silicon Processing for the VLSI Era, vol. 1—Process Technology, Lattice Press, 1986, pp. 397-399.

Wolf et al., "Silicon Processing for the VLSI Era," vol. 1, Lattice Press, 1986, pp. 292-294.

R. Kakkad et al., "Crystallized Si films by low-temperature rapid thermal annealing of amorphous silicon," Journal of Applied Physics, vol. 65, No. 5, Mar. 1, 1989, pp. 2069-2072.

G. Liu et al., "Polycrystalline silicon thin film transistors on Corning 7059 glass substrates using short time, low-temperature processing," Applied Physics Letters, vol. 62, No. 20, May 17, 1993, pp. 2554-2556.

G. Liu et al., "Selective area crystallization of amorphous silicon films by low-temperature rapid thermal annealing," Applied Physics Letters, vol. 55, No. 7, Aug. 14, 1989, pp. 660-662.

R. Kakkad et al., "Low Temperature Selective Crystallization of Amorphous Silicon," Journal of Non-Crystalline Solids, 115, 1989, pp. 66-68.

C. Hayzelden et al., "In Situ Transmission Electron Microscopy Studies of Silicide-Mediated Crystallization of Amorphous Silicon," Applied Physics Letters, vol. 60, No. 2, Jan. 13, 1992, pp. 225-227.

* cited by examiner

DISPLAY DEVICE

BACKGROUND OF THE INVENTION

1. Field of the Invention

The present invention relates to a method of manufacturing a semiconductor device possessing a lightly doped drain (LDD) region. More particularly, the invention relates to a method of manufacturing a thin film transistor (TFT) possessing a gate electrode which is covered by an oxide film.

The invention further relates to a method of forming an insulated gate type semiconductor device which is formed on an insulating surface and possesses a silicon active layer in the form of a thin film and of forming an integrated circuit in which a large number of these devices are formed. The semiconductor devices of the invention can be used as thin film transistors or integrated circuits of such transistors in the drive circuits of active matrices such as liquid crystal displays, etc. or image sensors, etc. or in SOI integrated circuits and conventional integrated circuits (microprocessors, microcontrollers, microcomputers and semiconductor memories, etc.). In the invention, 'insulating surface' does not just mean the surface of an insulating substrate but also includes the surface of insulating films that are provided on semiconductors or conductors.

2. Description of the Related Art

In recent years, the formation of insulated gate semiconductor devices-(or MOSFETs) on insulating surfaces has been tried. Such formation of semiconductor integrated circuits on insulating surfaces is advantageous in respect of high-speed drive of circuits, since, as opposed to conventional semiconductor integrated circuits in which the speed is mainly governed by the capacitance (stray capacitance) of the wiring and the substrate, this stray capacitance is not present on an insulating substrate. A MOSFET which is formed on an insulating substrate in this manner and possesses an active layer in the form of a thin film is called a thin film transistor (TFT). TFTs are essential for the purpose of raising the level of integration, and also for the purpose of forming integrated circuits as multilayer circuits. For example, TFTs are used as SRAM load transistors in semiconductor integrated circuits. It is also known to form TFTs for the purpose of driving active matrix type liquid crystal displays and image sensors, etc. In particular, because of the need for high-speed operation, crystalline silicon TFTs, with which mobility is higher, have recently been developed in place of amorphous silicon TFTs, in which amorphous silicon is used for the active layer.

If thin film transistors are to be used as drive elements in the individual pixel regions of an active matrix type liquid crystal display, it is necessary that the value of their off current be small. 'Off current' is the current that flows between the source and drain even though the thin film transistor is in the 'off state'. If the value of this off current is large, the charge held for a pixel falls, and it becomes impossible to maintain a screen display for a set time. The reason why off current occurs is that the thin film transistor constituting the active layer possesses a poly-crystalline structure or a microcrystalline structure.

For example, when an N-channel thin film transistor is in the off state, a negative voltage is imposed on the gate electrode. In this condition, the region of the channel-forming region which contacts the gate insulation film is P-type. Therefore, a PN junction is formed between the source and drain, and so hardly any current should flow. When, however, the active layer is constituted by a silicon film possessing a polycrystalline or a microcrystalline structure, migration of carriers (charges) via the crystal grain boundaries occurs, and this is the cause of off current.

An LDD (lightly doped drain) structure and an offset gate structure are known as structures for making this off current small. These are structures which are designed, mainly, to reduce the electric field strength at and in the vicinity of the interface of the channel-forming region and the drain region and thereby suppress migration of carriers via the crystal grain boundaries in this region.

However, in the case of TFTs, unlike the case with known semiconductor integrated circuit technology, there are still many problems that need to be solved, and there is the problem that it is difficult to produce required LDD structures or offset gate structures. In particular, when it is attempted to form a TFT on an insulating substrate such as a glass substrate, etc., there is the problem that, since the substrate becomes electrostatically charged, reactive ion anisotropic etching fails to function properly and etching therefore becomes unstable, and there is, for example, the problem that it is difficult to form fine patterns with good control.

FIG. 7 shows cross-sections of a typical LDD manufacturing process that has been employed hitherto. First, a base film 702 is formed on a substrate 701, and an active layer is formed with crystalline silicon 703. Then, an insulation film 704 is formed with material such as silicon oxide, etc. on this active layer. (FIG. 7(A))

Next, a gate electrode 705 is formed with polycrystalline silicon (doped with an impurity such as phosphorus, etc.), or with tantalum, titanium or aluminum, etc. Using this gate electrode as a mask, an impurity element (phosphorus or boron) is introduced by ion doping or a similar means, thereby forming, in a self-aligning manner in the active layer 703, lightly doped drain (LDD) regions 706 and 707 in which the dopant dose is small. The active layer region which is below the gate electrode and into which an impurity has not been introduced comes to constitute a channel-forming region. The impurity with which doping has been effected is then activated by a heat source such as a laser or a flashlamp, etc. (FIG. 7(B))

Next, an insulation film 708 of silicon oxide, etc. is, formed by plasma CVD, LPCVD or a similar means (FIG. 7(C)), and anisotropic etching of this film is effected to form a sidewall 709 adjacent the side surface of the gate electrode. (FIG. 7(D))

Then, the impurity element is introduced again, by ion doping or a similar means, and, since the gate electrode 705 and sidewall 709 are used as a mask, regions (source/drain regions) 710 and 711 with quite a high impurity concentration are formed in a self-aligning manner in the active layer 703. The doping impurity is then activated by a heat source such as a laser or a flashlamp, etc.

Finally, a layer insulator 712 is formed, contact holes are formed going through the layer insulator to the source/drain regions, and wiring/electrodes 713 and 714 that connect to the source and drain are formed with metal material such as aluminum, etc. (FIG. 7(F))

Recently, products that require semiconductor integrated circuits to be formed on transparent insulating substrates have made an appearance. Examples are the drive circuits of optical devices such as liquid crystal displays and image sensors. TFTs are also used in these circuits. These circuits are required to be formed with a large surface area, and a reduction in the temperature of the TFT manufactory process is therefore required. Also, in cases where a device with a large number of terminals is on an insulating substrate and these terminals have to be connected to a semiconductor integrated circuit, consideration has been given to forming the actual semiconductor integrated circuit itself or its first stage monolithically on the same insulating substrate in order to reduce the packaging density.

Conventionally, a TFT is produced by annealing an amorphous, semi-amorphous or microcrystalline silicon film at a temperature of 450-1200° C., to increase its crystallinity and improve it to a good-quality silicon film (ie, one with which mobility is sufficiently great), and using this as an active layer. There also exist amorphous silicon TFTs using amorphous silicon for the active layer, but the mobility in them is low, being 5 cm$^2$/VS, normally about 1 cm$^2$/Vs, and considerations of operating speed, and also consideration of the fact that they do not permit production of P-channel TFTs mean that there are considerable restrictions on their use. Annealing at a temperature such as noted above is necessary in order to produce a TFT in which the mobility is 5 cm$^2$/Vs. This annealing also makes it possible to produce a P-channel TFT (a PTFT).

Producing a high mobility TFT necessitates reducing the source/drain sheet resistance as well as that of the active layer. In particular, if the aim is to produce a TFT in which the field mobility exceeds 150 cm$^2$/Vs, the sheet resistance must be 200Ω/square, and, in view of this, a method using silicides for portions corresponding to the source/drain has been proposed.

FIG. 14 shows cross-sections of a typical currently devised TFT manufacturing process in which a silicide is used in order to reduce the sheet resistance of the portion corresponding to the source/drain section. First, a silicon active layer 1403 in the form of an island is formed on a substrate 1401. If required, a base film 1402 may be formed between the substrate and the active layer. Then, an insulation film 1404 that functions as a gate insulation film is formed with material such as silicon oxide, etc., on the active layer. (FIG. 14(A))

Next, a gate electrode 1405 is formed with poly-crystalline silicon (doped with an impurity such as phosphorus, etc. in order to lower the resistance), etc. Then, with this gate electrode as a mask, an impurity element (phosphorus or boron) is introduced by ion doping or a similar means, and impurity regions 1406 are formed in a self-aligning manner in the active layer 1403. The active layer region which is below the gate electrode and into which an impurity has not been introduced comes to constitute a channel-forming region. Then, the doping impurity is activated by thermal annealing, laser annealing, flashlamp annealing, rapid thermal annealing or a similar means. (FIG. 14(B))

Next, an insulation film 1407 of silicon oxide, etc. is formed by plasma CVD, LPCVD or a similar means (FIG. 14(C)), and a sidewall A1408 adjacent the side surface of the gate electrode is formed by anisotropic etching of this insulation film, by reactive ion etching or a similar means. (FIG. 14(D))

Then, a covering 1409 of a metal (eg, titanium, tungsten, molybdenum, platinum, or chromium, etc.) for forming a silicide over the whole surface is formed. (FIG. 14(E))

This is followed by thermal annealing, laser annealing or a similar means to react the metal covering 1409 and the impurity regions 1406 closely bonded thereto, and so form silicide regions 1410. At this time, the impurity region portions 1411 that are below the sidewall A1408 remain as impurity regions, since the metal covering 1409 is not formed on them. If silicon is used for the gate electrode, a silicide is also formed on the top surface of the gate electrode. On the other hand, the metal film deposited on the insulation film (silicon oxide, etc.) hardly reacts at all, and so a portion of the metal covering 1409 becomes a silicide, and the other portion thereof remains unreacted.

If, at this time, the ratio of the etching rates of the metal covering 1409 and its silicide is sufficiently great, it is possible to etch away only the unreacted metal covering. All the metals noted above are suitable for this purpose, since their etching rates are greater than those of their silicides. (FIG. 14(F))

Finally, a layer insulator 1412 is formed, contact holes going through the layer insulator to the source/drain regions are formed, and wiring/electrodes 1413 connecting to the source and drain are formed with metal material such as aluminum, etc. (FIG. 14(G))

In the element thus produced, the resistance of the silicide regions 1410 is much smaller than that of ordinary doped silicon doped with phosphorus or boron, and it can be effectively ignored. Therefore, what actually determines the source/drain sheet resistance is the width x of an impurity region 1411 below the sidewall, and since this is very small, it is possible to produce a TFT in which the source/drain sheet resistance is satisfactorily small.

SUMMARY OF THE INVENTION

The above method directly follows the procedure of a conventional LDD manufacturing process for semiconductor integrated circuits, and it comprises a stage which, if unmodified, is difficult to implement in manufacture of a TFT on a glass substrate, and stages which are undesirable in terms of productivity.

The difficulty lies in the formation of the sidewall. The thickness of the insulation films 708 and 1407 in FIG. 7 and FIG. 14 may be 0.5-2 μm, and since the thickness of the base film 702 or 1402 provided on the substrate is normally 1000-3000 Å, it often happens that a fall in the yield is caused due to the substrate being exposed because the base layer is etched by error in the etching stage. Such faults must be avoided as much as possible, since substrates, apart from synthetic quartz, that are used in TFT manufacture contain many elements that are harmful to silicon semiconductors. Further, it is also difficult to finish the sidewall to a uniform width. This is because fine control of the plasma in reactive ion etching (RIE) or similar plasma etching is difficult, since the substrate surface, unlike that of silicon substrates used in semiconductor integrated circuits, is insulating.

Further, because of their high resistance, the width of LDDs must be kept as small as possible, and an advance to mass production is difficult, because of the variability noted above, and the question of how to control a process for their self-alignment (ie, one in which positioning is effected without using a photolithographic method) constitutes a problem.

Another point is that, in the example shown in FIG. 14, when silicon is used for the gate electrode, a silicide is formed on the top surface of the gate electrode. However, when it is necessary to lower the gate electrode/wiring resistance (which applies, eg, in cases where the circuit size is large, and to liquid crystal displays, etc.), it is not always advantageous to use silicon for the gate electrode and it would be preferable to use metal material such as aluminum or titanium, etc., but there is the problem that even if such a metal is made a compound with the metal film 1409, it is not possible to effect selective etching, since the etching rate of the resulting compound does not differ greatly from that of the metal film 1409.

If, for example, aluminum is used for the gate electrode 1405, and titanium for the metal film 1409, titanium silicide is formed in the regions 1410. However, an aluminum/titanium alloy forms on the surface of the gate electrode. The titanium film can be etched by a mixed solution consisting of a hydrogen peroxide aqueous solution and ammonia, but the aluminum gate electrode is also etched at the same time. In other words, with the method of FIG. 14, the situation is that there is no choice but to use silicon or a silicide for the gate electrode, and this is a considerable obstacle to the reduction of the gate electrode's resistance.

It is accordingly the object of the present invention to provide a method of forming a thin film transistor which resolves the above problems and which simplifies the process. More specifically, it has as its object to resolve at least one of the following aspects.

(1) The manufacture, with good control, of thin film transistors with an LDD structure.

(2) The provision of a method of manufacturing, with excellent productivity, thin film transistors with a small off current.

(3) The provision of thin film transistors whose off current is small.

(4) The provision of thin film transistors possessing characteristics that are not achieved with a conventional LDD structure or offset gate structure.

It is an aspect of the structure of a 1st invention disclosed in this specification that, in a TFT possessing a gate electrode covered by an oxide film, it comprises a step in which the gate electrode is used as a mask, and an impurity at a low dose is introduced obliquely into a substrate, thereby forming low-concentration impurity regions in a self-aligning manner, and a step in which an impurity at a high dose is introduced into the substrate from the vertical direction, thereby forming high-concentration impurity regions in a self-aligning manner, wherein a lightly doped drain (LDD) region is formed below the oxide film.

A specific example of the above structure is shown in FIG. 3. The thin film transistor manufacturing stages shown in FIG. 3 are constituted as follows. In step (B), a gate electrode 306 covered by an oxide film 307 is formed. Then, using this gate electrode 306 and the oxide film 307 around it as a mask, impurity ions (in this case phosphorus ions) are implanted obliquely at a low dose in step (C), so forming low-concentration impurity regions 308. What is referred to here as a low dose is preferably a dose of $1 \times 10^{13}$-$5 \times 10^{14}$ cm$^{-2}$.

Then, in step (D) the impurity is introduced at a high dose from the vertical direction, so forming high-concentration impurity regions 309. What is referred to here as a high dose is preferably a dose of $10^{14}$-$5 \times 10^{15}$ cm$^{-2}$.

As a result of execution of step (D), low-concentration impurity regions can be formed in the active layer below the oxide film 307 that is around the gate electrode. The portion that is present on the drain side of these low-concentration impurity regions constitutes an LDD (lightly doped drain) region.

It is an aspect of the structure of a 2nd invention disclosed in this Specification that it comprises an active layer, a gate insulation film formed on this active layer, and a gate electrode formed on this gate insulation film, wherein an insulation layer in which the material constituting the gate electrode has been oxidized is formed on the side surface of the gate electrode, and low-concentration impurity regions are formed in the active layer region corresponding to the portion below this insulation film.

The structure shown in FIG. 3 can be cited as a specific example of the above structure. The portion indicated by 304 in FIG. 3 is the active layer, which is an important element constituting a thin film transistor. 305 is the gate insulation film. 306 is the gate electrode, and 307 is the insulation layer, which is produced by oxidizing the gate electrode 306 in an anodic oxidation stage. 310 indicates low-concentration impurity regions. The portion on the drain region side functions as an LDD (lightly doped drain) region.

The arrangement in a 3rd invention is that shield material provided around a gate electrode is taken as a mask, and impurity ions are implanted obliquely into an active layer portion that corresponds to the portion below the shield material.

It is an aspect of a 4th invention that it comprises an active layer, a gate insulation film formed on this active layer, and a gate electrode formed on this gate insulation film, wherein an oxide covering in which the material constituting the gate electrode has been oxidized is formed on the side surface of the gate electrode, low-concentration impurity regions are formed in the active layer region that corresponds to the portion below this oxide film, and a metal layer is formed on the outer surface of the portions of the active layer region which constitute source and drain regions.

It is an aspect of the structure of a 5th invention that, in a process for manufacturing a TFT possessing a gate electrode covered with an oxide covering, it comprises a step in which the gate electrode is taken as a mask and an impurity is implanted obliquely into the substrate, and a step in which a metal layer is formed on the outer surface of the active layer corresponding to the source and drain regions, wherein, in the step in which the impurity is introduced, an impurity region is formed in the active layer below the oxide covering.

A 6th invention is a method of manufacturing which comprises at least the following 9 steps, in the indicated order.

(1) A step in which a silicon region in the form of an island is formed on an insulating surface, (2) a step in which an insulation film that functions as a gate insulation film is formed on this silicon region, (3) a step in which a gate electrode is formed on this insulation film, (4) a step in which an anodic oxide is formed on the side surfaces and the top surface of this gate electrode (5) a step in which, with the gate electrode and anodic oxide taken as a mask, the silicon region is irradiated, from an oblique direction, with accelerated impurity ions, and impurity regions (source and drain) are formed in a self-aligning manner, (6) a step in which, with the gate electrode and anodic oxide taken as a mask, portions of the insulation film are removed, thereby exposing the upper surfaces of the impurity regions, (7) a step in which a metal film is formed over the entire surface, (8) a step in which the metal film and silicon are reacted, thereby forming silicide regions, and (9) a step in which unreacted portions of the metal film are removed A 7th invention is a method for manufacturing a semiconductor device which comprises at least the following 9 steps, in the indicated order.

(1) A step in which a silicon region in the form of an island is formed on an insulating surface, (2) a step in which an insulation film that functions as a gate insulation film is formed on this silicon region,
(3) a step in which a gate electrode is formed on this insulation film,
(4) a step in which, with the gate electrode taken as a mask, the silicon region is irradiated, from an oblique direction, with accelerated impurity ions, and impurity regions (source and drain) are formed in a self-aligning manner,
(5) a step in which an anodic oxide is formed on the side surfaces and the top surface of the gate electrode,
(6) a step in which, with the gate electrode taken as a mask, portions of the insulation film are removed, thereby exposing the surfaces of the impurity regions,
(7) a step in which a metal film is formed over the entire surface,
(8) a step in which this metal film and silicon are reacted, thereby forming silicide regions, and
(9) a step in which unreacted portions of the metal film are removed.

An 8th invention is a method of manufacturing a semiconductor device which comprises at least the following 9 steps, in the indicated order,
(1) A step in which a silicon region in the form of an island is formed on an insulating surface,
(2) a step in which an insulation film that functions as a gate insulation film is formed on this silicon region,
(3) a step in which a gate electrode is formed on this insulation film,
(4) a step in which an anodic oxide is formed on the side surfaces and the top surface of this gate electrode,
(5) a step in which, with the gate electrode and anodic oxide taken as a mask, portions of the insulation film are removed and the surfaces of the impurity regions are exposed,
(6) a step in which a metal film is formed over the entire surface,
(7) a step in which, with the gate electrode and anodic oxide taken as a mask, the silicon region is irradiated, from a oblique direction, with accelerated impurity ions, and impurity regions (source and drain) are formed in a self-aligning manner,
(8) a step in which the metal film and silicon are reacted, thereby forming silicide regions, and
(9) a step in which unreacted portions of the metal film are removed.

A 9th invention is a method of manufacturing a semiconductor device which comprises at least the following 9 steps, in the indicated order,
(1) A step in which a silicon region in the form of an island is formed on an insulating surface,
(2) a step in which an insulation film that functions as a gate insulation film is formed on this silicon region,
(3) a step in which a gate electrode is formed on this insulation film,
(4) a step in which an anodic oxide is formed on the side surfaces and the top surface of this gate electrode,
(5) a step in which, with the gate electrode and anodic oxide taken as a mask, portions of the insulation film are removed and the surfaces of the impurity regions are exposed,
(6) a step in which a metal film is formed over the entire surface,
(7) a step in which the metal film and silicon are reacted, thereby forming silicide regions,
(8) a step in which the unreacted portions of the metal film are removed, and
(9) a step in which, with the gate electrode and anodic oxide taken as a mask, the silicon region is irradiated, from an oblique direction, with accelerated impurity ions and impurity regions (source and drain) are formed in a self-aligning manner.

It is a feature of the inventions disclosed in this Specification that use is made of an anodic oxide covering produced by anodic oxidation of a gate electrode. Another feature is that formation of impurity regions is effected by irradiating the substrate with accelerated impurity ions from an oblique direction. The procedure employed in this process may be that the substrate is rotated while held tilted relative to the direction of the ion source (rotation-tilt ion implantation method).

The apparatus shown in FIG. 1 is used for this rotation-tilt ion implantation. The apparatus shown in FIG. 1 comprises a chamber 101, a sample holder (substrate holder) 102 and an anode 103 inside this chamber, a power supply 104 for supplying a high voltage to the anode 103, and a grid electrode 105. The angle θ of the sample holder 102 can be freely altered, so making it possible for ions to be injected obliquely. Also, the sample holder is provided with a rotation mechanism, and it can be rotated during ion implantation.

A voltage of up to a maximum of 100 kV is imposed on the anode 103. As a result of this high voltage, impurity ions 106 that are ionized by RF discharge, etc. in the vicinity of the grid electrode 105 are accelerated towards a substrate 107 (a sample) that is placed on the sample holder 102. Consequently, the accelerated impurity ions are implanted in the substrate.

A conceptual representation of this rotation-tilt ion implantation is shown in FIG. 2. As shown in FIG. 2(A), a TFT on a substrate mounted on the sample holder is held at an inclination θ relative to the ions with which doping is effected. The depth in which the impurity is introduced is determined by this inclination θ. In the invention, it is preferable that this inclination θ be 30 degrees or more. Since this angle θ is maintained, doping to as far as the portion below the gate electrode is effected in the region indicated by 201.

In the region 202, however, since part of the region is in the shadow of the gate electrode, doping is effected only in the part which does not extend as far as the gate electrode. If, now, the sample holder is rotated 180 degrees, doping is also effected to as far as the portion underneath the gate electrode in region 201, as illustrated in FIG. 2(B). In this manner, ion doping at a low dose is effected. The arrangement in this case may be that the sample holder is rotated 180 degrees and doping is effected, but the same effect can be achieved more simply if doping is effected while the sample holder is being rotated. In this Specification, rotation-tilt ion implantation is represented in the manner shown in FIG. 2(C).

Effecting rotation-tilt ion implantation in this manner makes it possible for an impurity layer doped to a set penetration distance to be formed easily and uniformly.

In particular, to form a low-concentration impurity region (constituting a lightly doped drain (LDD) region), an impurity at a low dose is introduced obliquely. After first effecting ion doping at a low dose, ion doping at a high dose is effected. In this case, the impurity is injected from the direction that is normal to the TFT. With the arrangement made thus, no high-dose ion doping is effected and so a low-concentration impurity region is formed in the portion below the gate electrode in which low-dose ion doping was effected in the preceding stage.

It is noted that, in formation of a low-concentration impurity region in a thin film transistor possessing a gate electrode covered by an oxide covering film, by controlling the angle of incidence of the implanted impurity, it is possible to form a low-concentration impurity region only in the portion that is below the anodic oxide, and it is also possible to form a low-concentration impurity region that overlaps the channel-forming region.

It is thus both possible to form an LDD and possible to form an overlap LDD. What is meant here by 'overlap LDD' is a region which, like the LDD shown in FIG. 4, is the result of formation of an LDD region (indicated as 415) to as far as underneath the gate electrode. In other words, in the case of an overlap LDD, an LDD region is formed over a portion of the region which, conventionally, would constitute a channel-forming region.

It is also a feature of the invention that a low-concentration impurity region is formed by irradiating a substrate obliquely with impurity ions. In the method illustrated in FIG. 1, accelerated impurity ions are obliquely incident, coming from a specific direction relative to the substrate, but since the substrate is rotated, the ultimate result, regardless of what the direction relative to the substrate is, is oblique injection of ions. In this process, the distance to which the impurity is introduced is determined by the tilt angle θ and the acceleration voltage. In the invention, the tilt angle θ is preferably 30° or more. Effecting rotation-tilt ion implantation in this manner makes it possible for a doped low-concentration impurity region to be formed easily and uniformly to a set penetration distance.

In general, when irradiation with impurity ions is effected obliquely, the distance to which the ions penetrate is determined by the ion acceleration voltage (or acceleration energy) and the penetration angle θ. In the invention, since the penetration angle θ can be changed easily and the width of the impurity region can therefore be controlled very efficiently, the impurity region can be made such it overlaps the gate electrode (be brought to an overlap state) or be so formed that it is distant from the gate electrode (an offset state), as required. It is therefore possible to form an LDD only in the portion that is below the oxide, and it is also possible to form an overlap LDD that extends from underneath the gate electrode. Further, it is possible to make the impurity region and source/drain relation that of an overlap state or that of an offset state.

Since it is thus possible for the region constituting the low-concentration impurity region to be formed with a good control characteristic, it is possible to produce a thin film transistor possessing required characteristics (in particular, the off current characteristic).

Preferably, the metal covering that is for the purpose of forming a silicide in the invention is constituted by material that makes possible the formation of an ohmic or a close-to-ohmic, low-resistance contact with a silicon semiconductor. Specifically, molybdenum (Mo), tungsten (W), platinum (Pt), chromium (Cr), titanium (Ti) and cobalt (Co) are suitable. In practice in the invention, a silicide is produced by reacting at least one of these metals with silicon.

The anodic oxide plays an important role in connection with this in the invention. If material such as aluminum, titanium or tantalum, etc. is used for the gate electrode, the anodic oxide produced reacts hardly at all with the metals noted above, and so the metal covering deposited thereon remains practically unreacted. Further, the anodic oxide acts as an etching stopper during etching of the metal covering.

Therefore, after formation of a silicide, the metal covering can be removed without the gate electrode and other portions being etched and the silicide of the portions corresponding to the source and drain remains.

In the invention, the choice of the gate electrode material is important, since, among other things, it determines the type of anodic oxide that will be formed. A pure metal such as aluminum, titanium or tantalum or an alloy of such a metal containing a small amount of an additive (eg, an alloy in which 1-3% of silicon is added to aluminum) can be used for the gate electrode in the invention. It is noted that in this specification, unless otherwise specified, the term aluminum is taken to mean not just pure aluminum but also material containing 10% of an additive. The same also applies to titanium and other materials.

In the invention, use may be made of a gate electrode with a single-layer structure using one of the above materials alone, or the gate electrode may be a multilayer structure in which these materials are stacked in two or more layers. Examples are a two-layer structure in which titanium overlies aluminum, and a two-layer structure in which aluminum overlies titanium. The thickness of each layer is determined by the person practicing the invention in accordance with the required element characteristics.

FIG. 10 will be taken as an example to describe the effects and advantages of the above. The process of FIG. 10 is one that corresponds to the 6th invention described earlier. As shown in FIG. 10(A), a gate electrode 1005 is formed on an active layer 1003 on a substrate 1001 on which a base film 1002 is formed, and an anodic oxide 1006 is formed on the gate electrode's top surface and side surfaces. (FIG. 10(A))

Next, oblique irradiation with an impurity is effected to form impurity regions 1007. As a result of this, the impurity regions also go round to underneath the anodic oxide 1006. (FIG. 10(B))

After that, an insulation film 1004 is etched, with the gate electrode and anodic oxide film serving as a mask. This etching etches away the portions of the silicon oxide film 1004 other than the silicon oxide film 1008 portion thereof that lies below the gate electrode and the anodic oxide. (FIG. 10(C)). Further, a metal covering 1009 for forming a silicide is deposited over the whole surface. (FIG. 10(D))

Then, the metal covering and impurity regions are reacted, so forming silicide regions 1011. However, the silicide reaction does not extend as far as the impurity region 1010 portions that are below the anodic oxide, and these portions therefore remain as impurity regions. Further, since the metal covering formed on the anodic oxide remains in a practically unreacted state, the unreacted portions of the metal film 1009 can be etched easily, and no etching of the gate electrode and other regions takes place.

In this manner, silicide regions 1011 and impurity regions 1010 are formed. Depending on how the silicide reaction progresses, the formation of the silicide may extend as far as the bottom of the active layer, as in FIG. 10(E), or may take place only on the surface of the active layer, as in FIG. 10(F). Naturally, in the former case, the sheet resistance of the portion corresponding to the source/drain is small, and in the latter case, too, the resistance is sufficiently low. In both cases, therefore, the source-drain sheet resistance is more or less determined by the impurity region 1010 width x.

The silicide thickness, which, too, is related to the above, is selected in accordance with the sheet resistance deemed necessary in the region corresponding to the source/drain. If it is required to achieve a sheet resistance of 10-100 Ω/square, this means that since the silicide's resistivity is 0.1-1 mΩ·cm, the silicide thickness is suitably 100 Å-1 μm.

In formation of a silicide in the invention, the silicide may be produced by irradiating the metal film with a strong light such as a laser, etc. and causing reaction with the silicon semiconductor film that is underneath it. If a laser is used, a pulsed laser is preferable. With a continuous laser, there is a risk of peel-off due to expansion of the irradiated material caused by heat, and thermal damage of the substrate may occur, since the irradiation time is long.

By way of a pulsed laser, one may use an infrared laser such as an Nd:YAG laser (Q-switched pulse oscillation being preferred), or, by way of a 2nd harmonic thereof, a visible light laser, or various types of ultraviolet lasers using excimers such as KrF, XeCl and ArF, etc., but it is necessary to select a laser with a wavelength such that it is not reflected by the metal film when irradiation is effected from above the metal film. Basically, there is hardly any problem when the metal film is very thin. Irradiation with laser light may also be effected from the substrate side. In this case, it is necessary to select laser light that passes through the silicon semiconductor film that is present underneath.

FIG. 11 shows a further development of the process of FIG. 10. First, a base film 1102, an active layer 1103, an insulation film 1104 that functions as a gate insulation film, and a gate electrode 1105 that can be anodically oxidized are formed on a substrate 1101, and anodic oxidation of the top surface and the side surfaces of the gate electrode is effected, so producing an anodic oxide 1106. Then, with the gate electrode and the anodic oxide as a mask, impurity regions 1107 are produced in the active layer by oblique irradiation with impurity ions. The impurity concentration at this time is made lower than usual, and the dose is set at, for example, $1 \times 10^{13}$-$5 \times 10^{14}$ atoms/cm$^2$. (FIG. 11(A))

Next, impurity regions 1108 are formed by irradiation with ions of the same conduction type from the generally vertical direction, with the impurity concentration greater than that of the previously formed impurity regions 1107. The dose in this case is suitably $1 \times 10^{14}$-$5 \times 10^{15}$ atoms/cm$^2$. As a result of this, low-concentration impurity regions 1109 are formed below the anodic oxide film. (FIG. 11(B))

Then, with the gate electrode and anodic oxide as a mask, the insulation film 1104 is etched, and a metal covering 1110 is deposited over the whole surface (FIG. 11 (C))

Then, the metal covering and the impurity regions are reacted, and silicide regions 1112 are formed. However, the silicide reaction does not extend as far as the impurity region 1109 portions that are below the anodic oxide, and these portions therefore remain as impurity regions. Since the metal covering formed on the anodic oxide remains in a practically unreacted state, the unreacted portions of the metal covering 1110 can be etched easily, and no etching of the gate electrode or other regions takes place.

In this manner, silicide regions 1112 are formed. Depending on how the silicide reaction progresses, the formation of a silicide may extend as far as the bottom of the active layer, as in FIG. 11(D), or may take place only on the surface of the active layer, as in FIG. 11(E). The type of formation should be selected in accordance with the requirements of the person practicing the invention.

After that, an interlayer insulator 1113 is deposited, contact holes are formed in the silicide regions, and metal wiring-electrodes are formed. Once this is done, the TFT is completed.

In the example of FIG. 11, doping with an impurity at low concentration was effected for the source/drain regions. In an ordinary TFT, when doping with an impurity at low concentration is effected in this manner, the field in the vicinity of the drain is eased, deterioration due to hot carrier injection is reduced and source-drain leakage current is also reduced, but in a device as in, eg, FIG. 10 in which the impurity regions 1007 are low-concentration regions, because the impurity concentration is low, the source-drain leakage current is liable to increase when the drain voltage is high, since the NI junction (PI junction in the case of a P-channel TFT) is thin and the distance between the silicide regions is short. High-concentration doping as in FIG. 11 is an effective way of preventing this.

FIG. 10 and FIG. 11 are drawings illustrating stages in the 6th invention, and, needless to say, similar effects and advantages are also achieved in the other inventions.

DETAILED DESCRIPTION OF THE PREFERRED EMBODIMENTS

EXAMPLE 1

Figure 1:
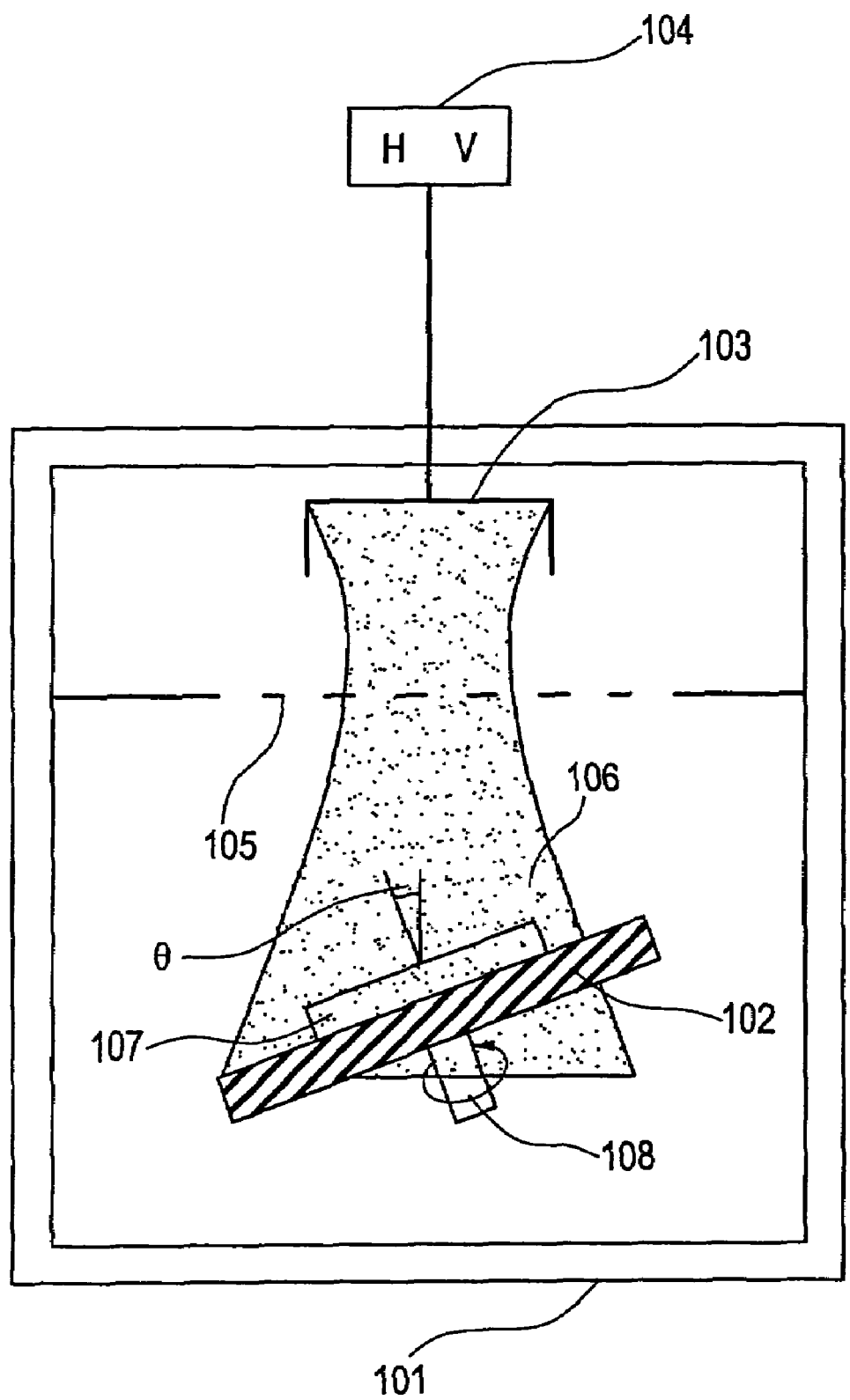
FIG. 1 shows an apparatus for effecting ion doping.

This example is shown in FIG. 3 and it is one in which an N-channel thin film transistor (TFT) possessing a lightly doped drain (LDD) region is formed by the invention.

First, silicon oxide was formed to 1000-5000 Å, eg, 4000 Å by a plasma CVD process to constitute a base oxide film 302 on a substrate 301 (Corning 7059, 100 mm×100 mm). This silicon oxide film serves to prevent diffusion of impurities from the glass substrate.

Then, an amorphous silicon layer 303 for forming an active layer was formed to 300-1500 Å by a plasma CVD process or LPCVD process. In this case, it was formed to 500 Å by a plasma CVD process. This may be followed by thermal annealing or laser annealing to effect crystallization. There is no objection if a catalyst element such as nickel etc. is added at this time in order to promote crystallization. (FIG. 3(A))

Next, this amorphous silicon film was patterned to form a silicon film 304 in the form of an island. This island-shaped silicon film 304 constitutes the TFT's active layer. Then, a silicon oxide film with a thickness of 200-1500 Å, 1000 Å in this case, was formed by a plasma CVD process, to constitute a gate insulation film 305.

After that a film of aluminum (containing 1 wt % of Si or 0.1-0.3 wt % of Sc) with a thickness of 1000 Å-3 μm, eg, 5000

Å, was formed by a sputtering process and was patterned to form a gate electrode 306. Next, the substrate was immersed in 1-3% ethylene glycol solution of tartaric acid with a pH of approximately 7, and anodic oxidation was effected, with the aluminum electrode as the anode and with platinum as the cathode. In the anodic oxidation, the voltage was first raised to 220 V, with the current constant, and the process was completed by maintaining this state for 1 hour. In this manner, a 2500 Å thick anodic oxide 307 was formed. (FIG. 3(B))

After that, with the gate electrode serving as a mask, phosphorus was introduced as an impurity in a self-aligning manner into the island-shaped silicon film 304 by an ion doping procedure. Phosphine ($PH_3$) was used as the doping gas. First, doping at a low dose was effected by the rotation-tilt implantation procedure illustrated in FIG. 2. The dose in this case was $1\times10^{13}$-$5\times10^{14}$ atoms/cm$^2$ and the acceleration voltage was 10-90 kV, eg, a dose of $5\times10^{13}$ atoms/cm$^2$ and an acceleration voltage of 80 kV. As a result, low-concentration impurity regions 308 were formed. (FIG. 3(C))

Next, high-dose ion doping was effected from the vertical direction. The dose at this time is preferably 1-3 orders of magnitude greater than the dose in the preceding doping. In this example, it was $2\times10^{15}$ atoms/cm$^2$, 40 times the preceding dose, and the acceleration voltage was 80 kV. This resulted in formation of high-concentration impurity regions 309. As a result of the above process, low-concentration impurity regions remained below the gate electrode and lightly doped drain (LDD) regions 310 were formed. (FIG. 3(D))

Further, the doped impurity regions 309 and 310 were activated by irradiation with a KrF excimer laser (wavelength 248 nm, pulse width 20 nsec). This laser irradiation was not effected from the vertical direction but was effected obliquely, as in the doping procedure at the time of LDD formation. The laser energy density was suitably 200-400 mJ/cm$^2$, and was preferably 250-300 mJ/cm$^2$. This stage may also be performed by thermal annealing.

Next, a silicon oxide film was formed to a thickness of 3000 Å by a plasma CVD process to constitute an interlayer insulation film 311. Then, contact holes for the TFT's source and drain were formed by etching the interlayer insulation film 311 and gate insulation film 305. Then, an aluminum film was formed by a sputtering process and patterned to form source and drain electrodes 312. (FIG. 3 (E))

The above process resulted in production of an N-channel TFT possessing an LDD. Formation of the TFT may be followed by the further step of hydrogenation treatment at 200-400° C. for the purpose of activating the impurity regions. In production of the LDD, control of the angle of incidence in implantation of the impurity at the time of formation of the low-concentration impurity regions 308 makes it possible to form the LDD only under the anodic oxide 307, as in this example, or to make it an overlap LDD in which a low-concentration impurity region is formed as far as underneath the gate electrode.

EXAMPLE 2

This example is shown in FIG. 4, and it is one in which, using the invention, an N-channel TFT possessing an overlap LDD and an N-channel TFT that does not possess such an LDD are formed on one and the same substrate.

First, similarly to Example 1, a silicon oxide film was formed to 3000 Å on a substrate 401 (Corning 7059) by a plasma CVD process to constitute a base oxide film 402. Then, an amorphous silicon film for forming an active layer was formed to 500 Å by a plasma CVD process. After that, crystallization was effected by leaving this material in a reducing atmosphere at 550-600° C. for 8-24 hours. There is no objection if a small amount of a catalyst element such as nickel, etc. for promoting crystallization is added at this time. (FIG. 4(A))

Next, the resulting crystalline silicon film 403 was patterned to define silicon films 404 and 405 in the form of islands. These island-shaped silicon films constituted TFT active layers. Then, a 800 Å thick silicon oxide film was formed as a gate insulation film 406 by a plasma CVD process.

After that, a 6000 Å thick film of aluminum (containing 1 wt % of Si or 0.1-0.3 wt % of Sc) was formed by a sputtering process, and was patterned to define gate electrodes 407 and 408. Next, the substrate was immersed in a pH is approximately 7 ethylene glycol solution containing 1-3% of tartaric acid, and anodic oxidation was effected, with the aluminum electrodes as anodes and with platinum as a cathode. For the anodic oxidation, the voltage was first raised to 220 V, with the current constant, and the process was completed by maintaining this state for 1 hour. In this manner, 2500 Å thick anodic oxidation products 409 and 410 were formed. (FIG. 4(B))

After that, with the gate electrode portions serving as masks, phosphorus was introduced in a self-aligning manner into the island-shaped silicon films by an ion doping procedure. First, the region that was to constitute an N-channel TFT without an LDD was covered with a photoresist mask 411, and phosphorus was introduced into the region that was to constitute an N-type TFT possessing an overlap LDD. In this process, doping at a low dose was effected by the rotation-tilt ion implantation procedure illustrated in FIG. 2. The angle of incidence for the ion implantation at this time was large, so as to effect formation of the low-concentration impurity region as far as underneath the gate electrode portion. The dose in this case was $1\times10^{13}$-$5\times10^{14}$ atoms/cm$^2$, and the acceleration voltage was 10-90 kV, eg, a dose of $4\times10^{13}$ atoms/cm$^2$ and an acceleration voltage of 80 kV. This resulted in the formation of low-concentration impurity regions 412. (FIG. 4(C))

Next, the photoresist mask 411 covering the region that was to constitute an N-channel TFT without an LDD was removed, and high-dose ion doping was effected from the vertical direction. It is preferable that the dose at this time be 1-3 orders of magnitude greater than the dose in the previously effected doping. In this example, the dose was $2\times15^{15}$ atoms/cm$^2$, 50 times the previous dose, and the acceleration voltage was 80 kV. High-concentration impurity regions 413 and 414 were formed as a result. The above process resulted in the formation of N-type impurity regions (source/drain regions) with an overlap LDD 415, and N-type impurity regions without an LDD. (FIG. 4(D))

Further, in this example, the doped impurity regions 413, 414 and 415 were activated by laser irradiation via the rear surface of the substrate. In this case, the laser light would be absorbed by the substrate and fail to reach the impurity regions if a KrF excimer laser (wavelength 248 nm, pulse width 20 nsec) were used, and therefore a laser with a different wavelength, in the form of an XeCl excimer laser (wavelength 308 nm, pulse width 30 nsec) or an XeF excimer laser (wavelength 353 nm, pulse width 40 nsec) should be used. An XeCl excimer laser was used in this example. The laser energy density was suitably 200-400 mJ/cm$^2$, and was preferably 250-350 mJ/cm$^2$. This stage may also be performed by thermal annealing.

Next, a silicon oxide film was formed to a thickness of 3000 Å as a layer insulation film 416 by a plasma CVD process. Then, contact holes for the TFT sources and drains were formed by etching the layer insulation film 416 and the gate insulation film 406. Then, an aluminum film was formed by a sputtering process, and was patterned to define source/drain electrodes 417. (FIG. 4(E))

As the result of the above process, an N-channel TFT possessing an overlap LDD and an N-channel TFT without an LDD were produced on one and the same substrate. The TFT formation may be further followed by hydrogenation treatment at 200-400° C. for the purpose of activating the impurity regions.

EXAMPLE 3

This example is shown in FIG. 5, and it is one in which, using the invention, a complementary circuit consisting of an N-channel TFT possessing a lightly doped drain (LDD) and a P-channel TFT that does not possess an LDD is formed.

First, similarly to Example 1, a silicon oxide film was formed to 3000 Å on a substrate 501 (Corning 7059) by a plasma CVD process to constitute a base oxide film 502. Then, an amorphous silicon film for forming an active layer was formed to 500 Å by plasma CVD process. After that, crystallization was effected by leaving this material in a reducing atmosphere at 550-600° C. for 8-24 hours. There is no objection if a small amount of a catalyst element such as nickel, etc. for promoting crystallization is added at this time. (FIG. 5(A))

Next, the crystalline silicon film 503 was patterned, and silicon films 504 and 505 in the form of islands were defined. These island-shaped silicon films constituted TFT active layers. Then, a 800 Å thick silicon oxide film was formed as a gate insulation film 506 by a plasma CVD process.

After that, a 6000 Å thick film of aluminum (containing 1 wt % of Si or 0.1-0.3 wt % of Sc) was formed by a sputtering process, and was patterned to define gate electrodes 507 and 508. Next, the substrate was immersed in 1-3% ethylene glycol solution of tartaric acid with a pH of approximately 7, and anodic oxidation was effected, with the aluminum electrodes as anodes and with platinum as a cathode. For the anodic oxidation, the voltage was first raised to 220 V, with the current constant, and the process was completed by maintaining this state for 1 hour. In this manner, 2500 Å thick anodic oxidation products 509 and 510 were formed. (FIG. 5(B))

After that, with the gate electrode portions serving as masks, phosphorus was introduced in a self-aligning manner into the island-shaped silicon films by an ion doping procedure. First, the region that was to constitute a P-channel TFT was covered with a photoresist mask 511, and phosphorus was introduced into the region that was to constitute an N-type TFT possessing an overlap LDD. First, doping at a low dose was effected by the rotation-tilt ion implantation procedure illustrated in FIG. 2. The dose in this case was $1 \times 10^{13}$-$5 \times 10^{14}$ atoms/cm$^2$, and the acceleration voltage was 10-90 kV, eg, a dose of $2 \times 10^{13}$ atoms/cm$^2$ and an acceleration voltage of 80 kV. This resulted in the formation of low-concentration impurity regions 512. (FIG. 5(C))

Next, high-dose ion doping was effected from the vertical direction. It is preferable that the dose at this time be 1-3 orders of magnitude greater than the dose in the preceding doping. In this example, the dose was $1 \times 15^{15}$ atoms/cm$^2$, 50 times the previous dose, and the acceleration voltage was 80 kV. High-concentration impurity regions 513 were formed as a result. The above process resulted in the formation of N-type impurity regions (source/drain regions) with an LDD 514. (FIG. 5(D))

After that, the mask 511 covering the P-channel TFT region was removed, the region for constituting the N-channel TFT was covered with a photoresist mask 515, and boron was introduced into the P-channel TFT region. The dose in this case was $1 \times 10^{13}$-$5 \times 10^{15}$ atoms/cm$^2$ and the acceleration voltage was 5-80 kV, eg, a dose of $1 \times 10^{15}$ atoms/cm$^2$ and an acceleration voltage of 65 kV. This resulted in the formation of P-type impurity regions 516 (source/drain regions). (FIG. 5(E))

Further, the doped impurity regions 513, 514 and 516 were activated by irradiation with a KrF excimer laser (wavelength 248 nm, pulse width 20 nsec). In this case, normal activation from the vertical direction was effected. The laser energy density was suitably 200-400 mJ/cm$^2$, and was preferably 250-300 mJ/cm$^2$. This stage may also be effected by thermal annealing.

Next, a silicon oxide film was formed to 3000 Å by plasma CVD process to constitute a layer insulation film 517. Then, contact holes for the TFT sources and drains were formed by etching the layer insulation film 517 and the gate insulation film 506. Then, an aluminum film was formed by a sputtering process, and was patterned to define source/drain electrodes 518.

The above steps produced a complementary circuit constituted by an N-channel TFT possessing an LDD and a P-channel TFT without an LDD.

EXAMPLE 4

This example is shown in FIG. 6, and it is one which relates to a monolithic active matrix circuit. In this example, a complementary circuit which was produced by the invention and was constituted by an N-channel TFT and a P-channel TFT possessing lightly doped drain (LDD) regions was used as a drive circuit, and a P-channel TFT that did not possess an LDD was used as a matrix circuit switching element.

First, similarly to Example 1, a silicon oxide film was formed to a thickness of 2000 Å on a substrate 601 (Corning 7059) by a plasma CVD process to constitute a base oxide film 602. Then an amorphous silicon film for constituting an active layer was formed by a plasma CVD process to a thickness of 500 Å. After that, crystallization was effected by leaving the material in a reducing atmosphere at 550-600° C. for 8-24 hours.

Next, the amorphous silicon film was patterned to define silicon films in the form of islands. These island-shaped silicon films constituted TFT active layers. Then, a 1000 Å thick silicon oxide film was formed as a gate insulation film 603 by a plasma CVD process.

After that, a 5000 Å thick aluminum film was formed by a sputtering process, and was patterned to define gate electrodes 604, 605 and 606. Next, the substrate was immersed in 1-3% ethylene glycol solution of tartaric acid with a pH of approximately 7, and anodic oxidation was effected, with the aluminum electrodes as anodes and platinum as a cathode, so producing 2000 Å thick anodic oxidation products 607, 608 and 609.

After that, with the gate electrodes serving as masks, an impurity was introduced in a self-aligning manner into the island-shaped silicon oxide films by an ion doping procedure. First, the region that was to constitute the P-channel TFT that did not possess an LDD and the region that was to constitute the drive circuit N-channel TFT were covered with a photoresist mask 610, and boron was introduced into the region that was to constitute the P-channel TFT of the drive circuit. First, doping was effected at a low dose by the rotation-tilt ion implantation procedure illustrated in FIG. 2. The dose in this case was $1\times10^{13}$-$5\times10^{14}$ atoms/cm$^2$ and the acceleration voltage was 5-80 kV, eg, a dose of $3\times10^{13}$ atoms/cm$^2$ and an acceleration voltage of 60 kV. This resulted in formation of P-type low-concentration impurity regions 611 in the region for constituting the drive circuit P-channel type TFT. (FIG. 6(A))

Next, the photoresist mask covering the region for constituting the P-channel TFT without an LDD was removed, and the island-shaped silicon film was doped with boron ions from the vertical direction. It is preferable that the dose in this case be 1-3 orders of magnitude greater than the dose in the previously effected doping. In this example, it was $3\times10^{15}$ atoms/cm$^2$, 100 times the previous dose, and the acceleration voltage was 60 kV. This resulted in formation of high-concentration impurity regions 612 and 613. As a result of the above process, P-type impurity regions (source/drain regions) possessing an LDD 614 and P-type impurity regions (source/drain regions) without an LDD were formed. (FIG. 6(B))

Next, the photoresist mask 610 covering the region for constituting the drive circuit's N-channel TFT was removed, and the P-channel TFT regions into which an impurity had been introduced earlier were covered with photoresist masks 615.

After that, phosphorus was introduced into the region for constituting the drive circuit N-channel TFT. First, low-dose doping was effected by the rotation-tilt ion implantation procedure illustrated in FIG. 2. The dose in this case was $1\times10^{13}$-$5\times10^{14}$ atoms/cm$^2$ and the accelerator voltage was 10-90 kV, eg, a dose of $3\times10^{13}$ atoms/cm$^2$ and an acceleration voltage of 70 kV. This resulted in formation of N-type low-concentration impurity regions 616 in the region constituting the drive circuit's N-channel TFT. (FIG. 6(C))

Next, high-dose doping with phosphorus ions was effected from the vertical direction. It is preferable that the dose at this time be 1-3 orders of magnitude greater than the dose in the previously effected doping. In this example, the dose was $3\times10^{15}$ atoms/cm$^2$, 100 times the previous dose, and the acceleration voltage was 70 kV. This resulted in formation of high-concentration impurity regions 617. As a result of the above process, N-type impurity regions (source/drain regions) with an LDD 618 were formed. (FIG. 6(D))

Further, the doped impurity regions were activated by irradiation with a KrF excimer laser (wavelength 248 nm, pulse width 20 nsec). The laser energy density was suitably 200-400 J/cm$^2$, and was preferably 250-300 mJ/cm$^2$.

Next, a silicon oxide film was formed to a thickness of 3000 Å as a layer insulation film 619 by plasma CVD process. Then, contact holes for the TFT sources and drains were formed by etching the layer insulation film 619 and gate insulation film 603. Then, an aluminum film was formed by a sputtering process, and was patterned to define source/drain electrodes 620. (FIG. 6(E))

After that, a silicon nitride film was formed to a thickness of 3000 Å by a plasma CVD process to constitute a passivation film 621, and this and the layer insulation film 619 and gate insulation film 603 were etched to form a contact hole, and a pixel electrode 622 was formed by a transparent conductive film on the active matrix circuit TFT. (FIG. 6(F))

The above process resulted in production of a monolithic active matrix circuit in which a complementary circuit which was produced by the invention and was constituted by an N-channel TFT and a P-channel TFT possessing LDDs was used as the drive circuit and a P-channel TFT without an LDD was used as the active matrix circuit's switching element. It is noted that TFT formation may be followed by hydrogenation at 200-400° C. for the purpose of activating the impurity regions.

EXAMPLE 5

This example is shown in FIG. 8. A special feature of the thin film transistor illustrated in this example is that, for the source/drain region, use is made of a region in which a titanium nitride film is formed on a lightly doped drain (a region for which doping has been effected at a comparatively low concentration).

First, silicon oxide was formed to 1000-5000 Å, eg, 4000 Å by a plasma CVD process to constitute a base oxide film 302 on a substrate 301. This silicon oxide film serves to prevent diffusion of impurities from the glass substrate.

Then, an amorphous silicon film 303 for constituting an active layer was formed to 300-1500 Å by a plasma CVD process or an LPCVD process. In this case, it was formed to 700 Å by a plasma CVD process. This may be followed by thermal annealing or laser annealing to effect crystallization. There is no objection if a catalyst element such as nickel etc. is added at this time in order to promote crystallization of the amorphous silicon film.

Next, this amorphous silicon film was patterned to define a silicon film 304 in the form of an island. This island-shaped silicon film 304 constitutes the TFT's active layer. Then, a silicon oxide film with a thickness of 200-1500 Å, 1000 Å in this case, was formed by plasma CVD process, to constitute a gate insulation film 305.

After that, a film of aluminum (containing 1 wt % of Si or 0.1-0.3 wt % of Sc) with a thickness of 1000 Å-3 μm, eg, 5000 Å, was formed by a sputtering process and was patterned to define a gate electrode 306. Next, the substrate was immersed in 1-3% ethylene glycol solution of tartaric acid with a pH of approximately 7, and anodic oxidation was effected, with the aluminum electrode as the anode and with platinum as the cathode. In the anodic oxidation, the voltage was first raised to 220 V, with the current constant, and the process was completed by maintaining this state for 1 hour. In this manner, a 2500 Å thick anodic oxidation product 307 was formed. (FIG. 8(A))

After that, with the gate electrode portion as a mask, phosphorus was introduced as an impurity in a self-aligning manner into the island-shaped silicon film 304 constituting an active layer by an ion doping or plasma doping procedure. Phosphine (PH$_3$) was used as the doping gas. First, the doping was effected at a low dose by the rotation-tilt procedure illustrated in FIG. 2. It is satisfactory for this purpose if the dose is $1\times10^{14}$-$5\times10^{14}$ atoms/cm$^2$ and the acceleration voltage is 10-90 kV. In this case, the dose was $2\times10^{14}$ atoms/cm$^2$ and the acceleration voltage 80 kV. This resulted in formation of low-concentration impurity regions 308. Further, a channel-forming region 804 is formed in a self-aligning manner in this process. (FIG. 8(B))

Figure 8A:
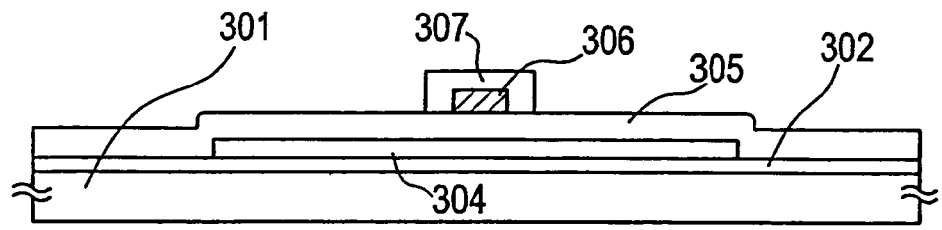
FIGS. 8(A) to 8(E) show the stages of manufacture of the thin film transistor of a 5th example.
Figure 8B:
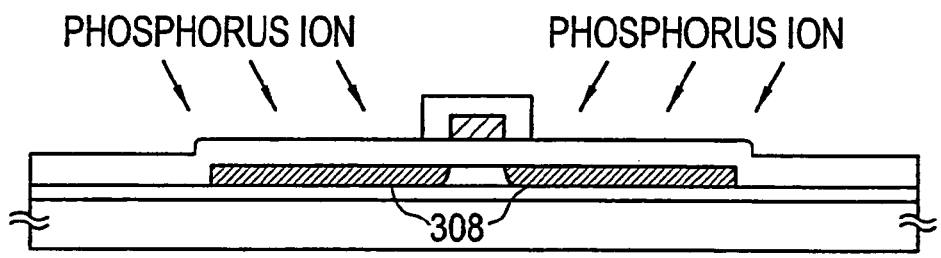
Figure 8C:
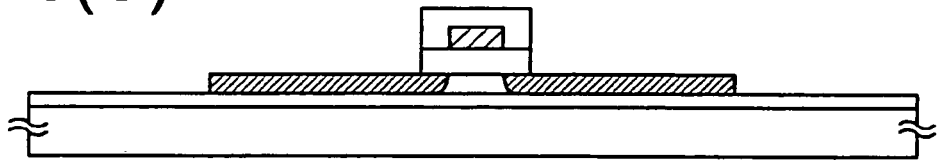
Figure 8D:
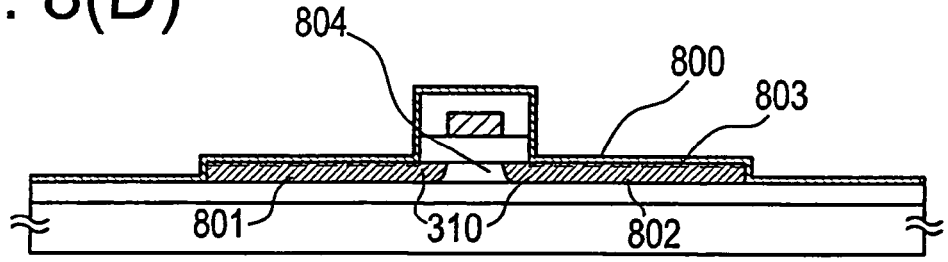

Next, the exposed gate insulation film 305 was removed, so giving the state shown in FIG. 8(C). Further, a metal film 800 was formed to a thickness of 50-500 Å by a sputtering process. In this case, a titanium film was formed to a thickness of 200 Å by a sputtering process as the metal film 800. Instead of a titanium film, it is also possible to use metal material such as nickel, molybdenum, tungsten, platinum or palladium, etc.

Then, irradiation with laser light (eg, a KrF excimer laser) was effected to activate the impurity in which doping had been effected and to recrystallize the low-concentration impurity regions, and, together with this, to form a metal silicide layer 803 (a titanium silicide layer in this case) at and in the vicinity of the interface of the metal film 800 and the active layer. If a KrF excimer laser is used, it is satisfactory if the laser light's irradiation density is 250-300 mJ/cm$^2$. Also, it is effective if the sample material is heated to 200-500° C. during the heating by laser light. Irradiation with intense light may be effected instead of laser light irradiation. (FIG. 8(D))

After formation of the metal compound layer 803, the metal film 800 was etched in an etching solution constituted by a 5:2:2 mixture of hydrogen peroxide, ammonia and water. Then, a silicon oxide film 311 was formed to a thickness of 6000 Å as a layer insulation film, and contact holes for the TFT source and drain were formed in a hole opening stage. Then, an aluminum film was formed by a sputtering process, and was patterned to define source/drain electrodes 312. (FIG. 8(E))

The above process produced a TFT with an N-channel LDD. TFT formation may be further followed by hydrogenation treatment at 200-400° C. for the purpose of activating the impurity regions. The TFT shown in FIG. 8(E) has a structure in which the source and drain regions have a metal silicide film on a low-concentration impurity region, and in which a low-concentration impurity region that functions as an LDD region is formed between the channel-forming region and one or the other of the source region and the drain region.

Figure 8E:
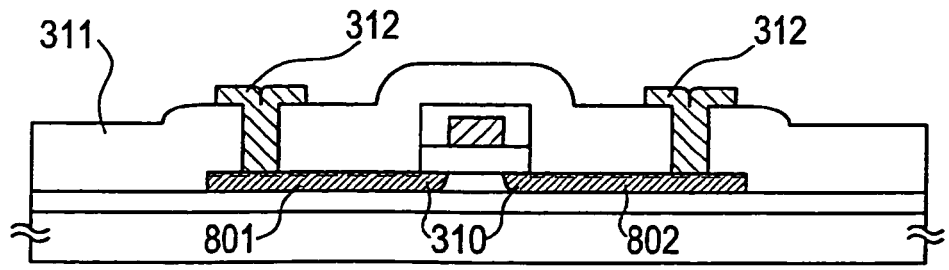

The source and drain regions 801, 802 in the structure shown in FIG. 8(E) are lightly doped impurity regions, but since the metal silicide layer 803 is formed on their surfaces, their resistance is low and they fully perform their functions as source and drain regions. The low-concentration impurity regions 308 which do not have the metal silicide layer 803 formed on them (and which coincide with the regions indicated by 310) serve as regions for easing field concentration adjacent the channel-forming region 804. (The one on the drain region side being an LDD (lightly doped region)).

The TFT manufacturing process described in this example simplifies the manufacturing procedure and so makes it possible to improve productivity, since impurity ion implantation is effected only once, and only light doping is needed.

EXAMPLE 6

The manufacturing process in this example of practice is shown in FIG. 9. The special feature of the thin film transistor that is described in this example is that a metal silicide layer for reducing the resistance of the source/drain region and for improving the characteristics of contact between the source and drain regions and their electrodes is formed on the outer surface of the source/drain regions.

First, silicon oxide was formed to 1000-5000 Å, eg, 4000 Å by a plasma CVD process to constitute a base oxide film 302 on a substrate 301. This silicon oxide film serves to prevent diffusion of impurities from the glass substrate.

Then, an amorphous silicon film for constituting an active layer was formed to 300-1500 Å by a plasma CVD process or an LPCVD process. In this case, it was formed to 1000 Å by a plasma CVD process. This may be followed by thermal annealing or laser annealing to effect crystallization. There is no objection if a catalyst element such as nickel etc. is added at this time in order to promote crystallization.

Next, this amorphous silicon film was patterned to form a silicon film 304 in the form of an island. This island-shaped silicon film 304 constitutes the TFT's active layer. Then, a silicon oxide film with a thickness of 100-1500 Å, 1000 Å in this case, was formed by a plasma CVD process, to constitute a gate insulation film 305.

After that a film of aluminum (containing 1 wt % of Si or 0.1-0.3 wt % of Sc) with a thickness of 1000 Å-3 µm, eg, 5000 Å, was formed by a sputtering process and was patterned to form a gate electrode 306. Next, the substrate was immersed in ethylene glycol solution containing 1-3% of tartaric acid with a pH of approximately 7, and anodic oxidation was effected, with the aluminum electrode as the anode and with platinum as the cathode. In the anodic oxidation, the voltage was first raised to 220 V, with the current constant, and the process was completed by maintaining this state for 1 hour. In this manner, a 2500 Å thick anodic oxide 307 was formed. (FIG. 9(A))

After that, with the gate electrode serving as a mask, phosphorus was introduced as an impurity in a self-aligning manner into the island-shaped silicon film 304 by an ion doping or plasma doping procedure. Phosphine (PH$_3$) was used as the doping gas. First, doping at a low dose was effected by the rotation-tilt implantation procedure illustrated in FIG. 2. It is satisfactory if the dose in this case is made 1×10$^{14}$-5×10$^{14}$ atoms/cm$^2$ and the acceleration voltage is 10-90 kV. Here, the dose was 2×10$^{14}$ atoms/cm$^2$ and the acceleration voltage was 80 kV. As a result, low-concentration impurity regions 308 were formed. Also, a channel-forming region 804 was formed in a self-aligning manner in this stage. (FIG. 9(B))

Next, doping with phosphorus ions at a dose of 2×10$^{15}$ cm$^{-2}$ was effected by a plasma doping procedure. This doping was effected normally to the substrate. This stage resulted in the formation of a pair of high-concentration impurity regions 309 serving as source and drain regions. (FIG. 9(C))

Figure 9A:
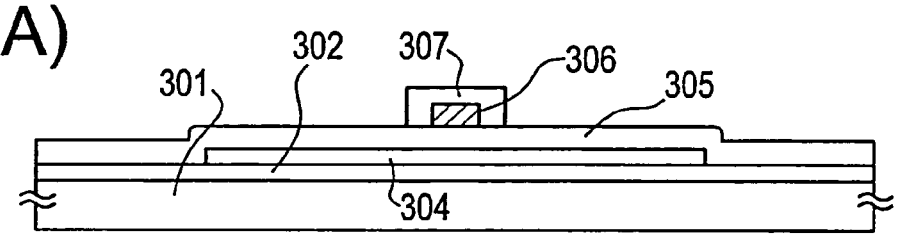
FIGS. 9(A) to 9(F) show the stages of manufacture of the thin film transistor of a 6th example.
Figure 9B:
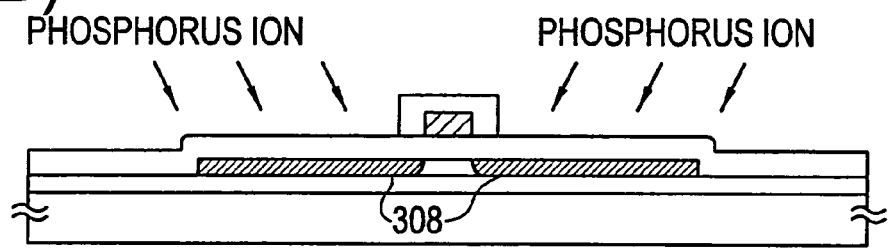
Figure 9C:
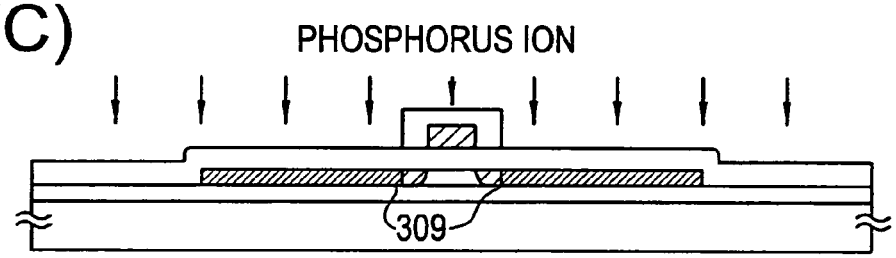
Figure 9D:
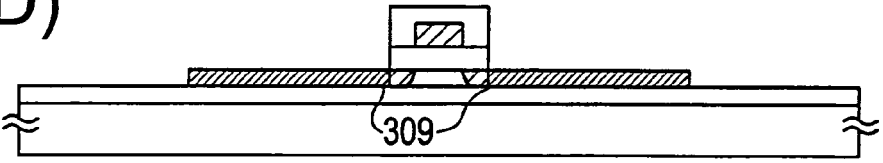
Figure 9E:
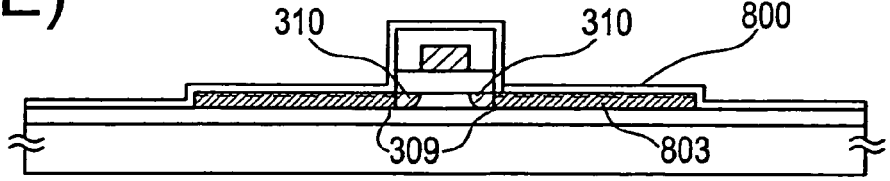
Figure 9F:
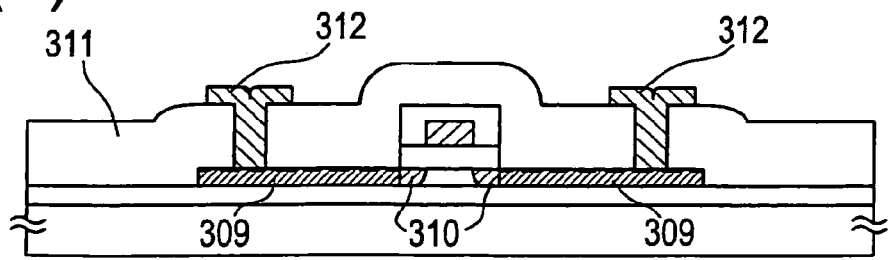
Figure 10A:
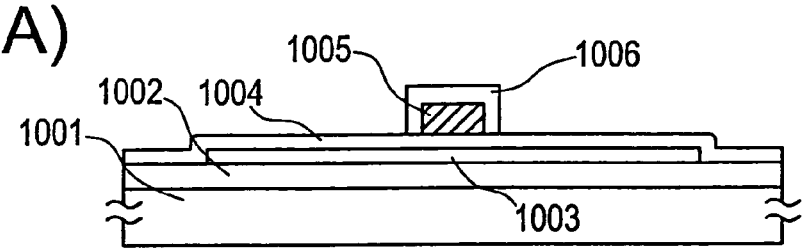
FIGS. 10(A) to 10(F) show the stages of manufacture of a thin film transistor of the invention.
Figure 10B:
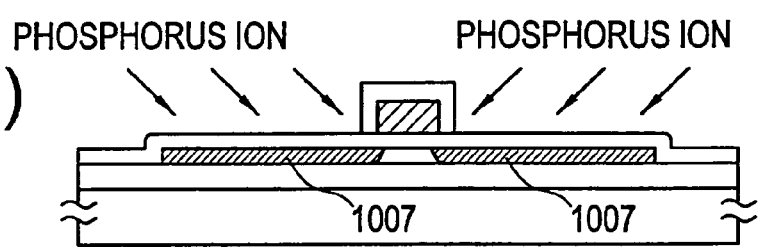
Figure 10C:
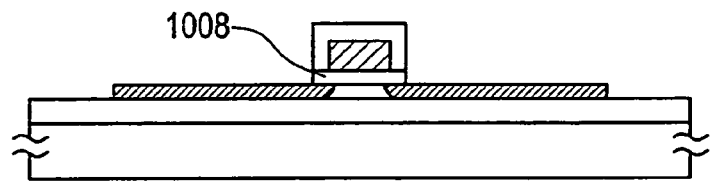
Figure 10D:
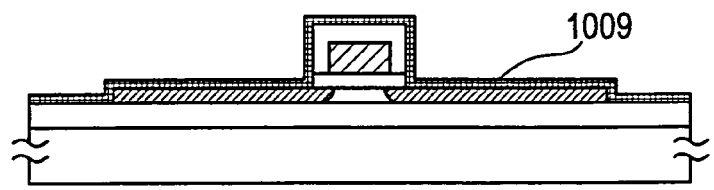
Figure 10E:
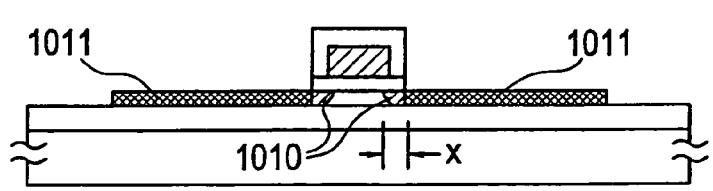
Figure 10F:
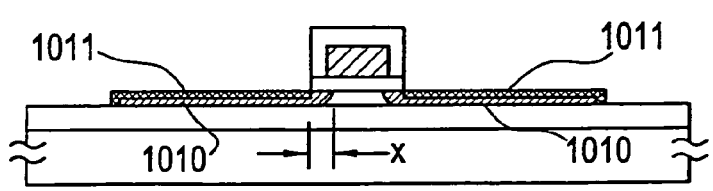
Figure 11A:
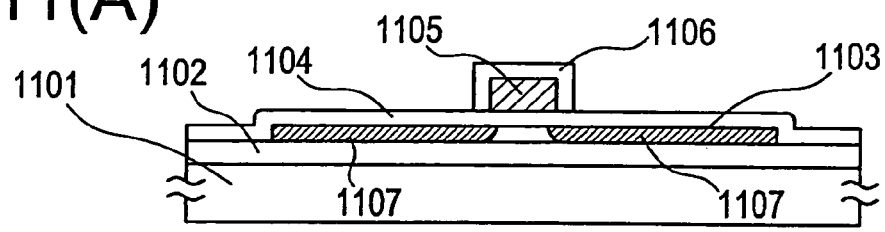
FIGS. 11(A) to 11(F) show the stages of manufacture of another thin film transistor of the invention.
Figure 11B:
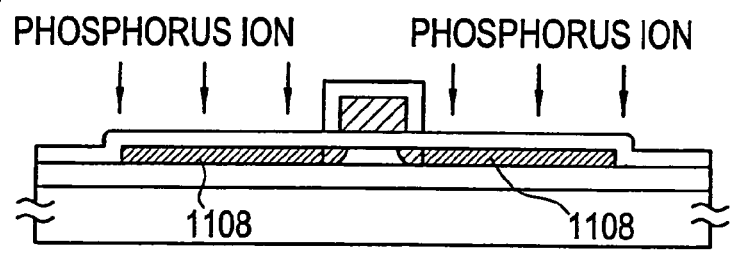
Figure 11C:
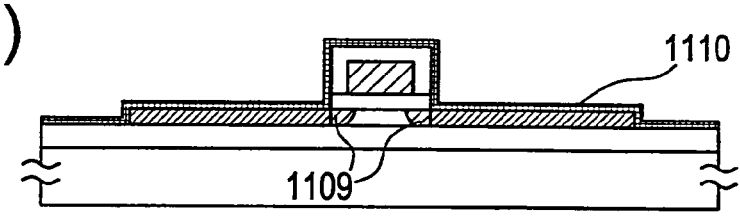
Figure 11D:
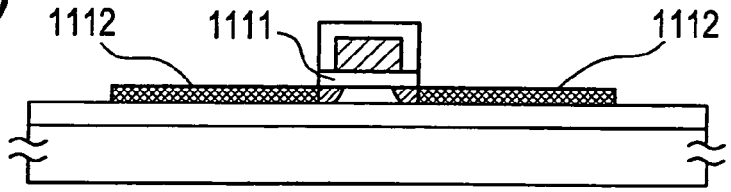
Figure 11E:
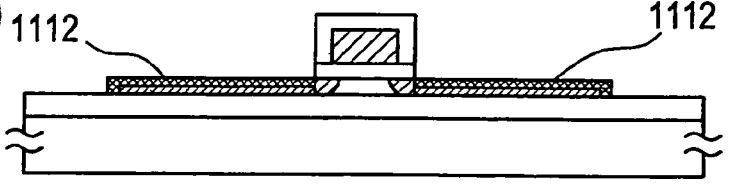
Figure 11F:
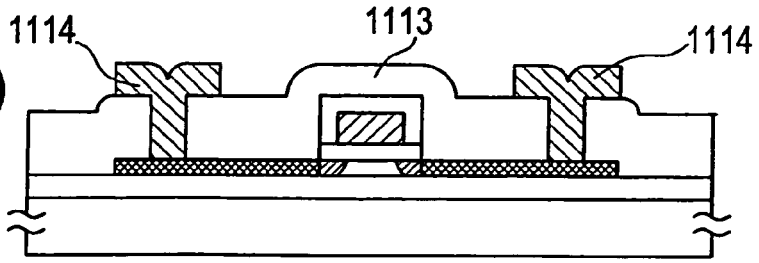
Figure 12A:
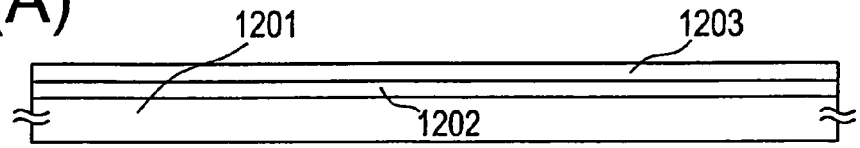
FIGS. 12(A) to 12(G) show the stages of manufacture of the thin film transistor of a 7th example.
Figure 12B:
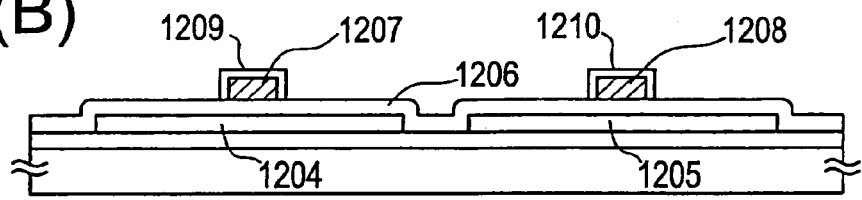
Figure 12C:
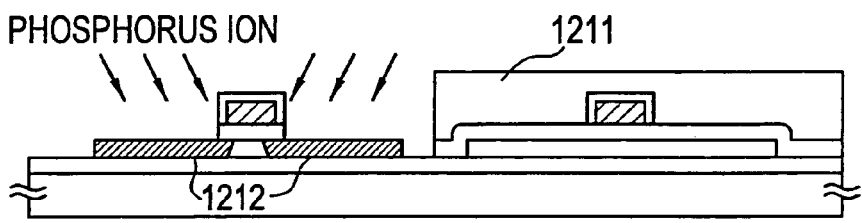
Figure 12D:
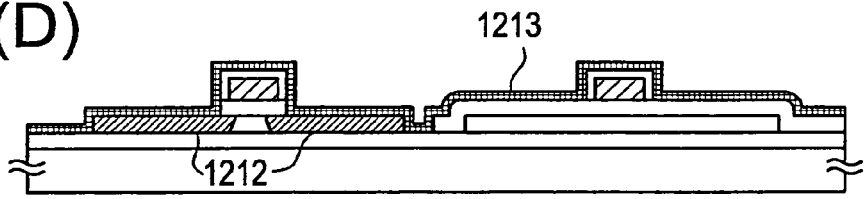
Figure 12E:
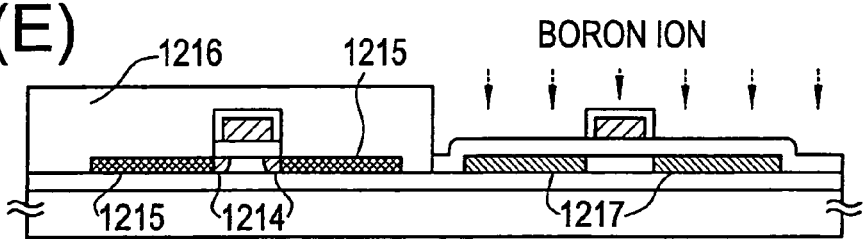
Figure 12F:
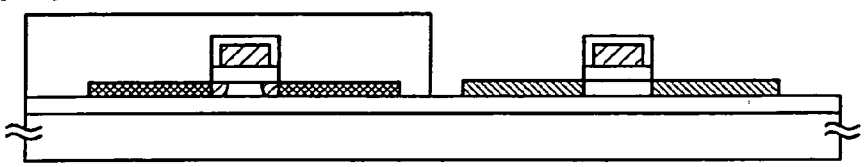
Figure 12G:
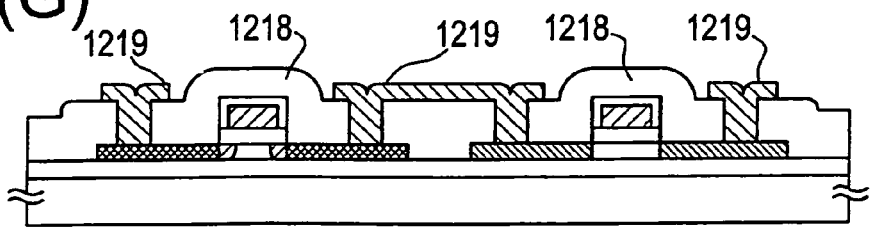
Figure 13A:
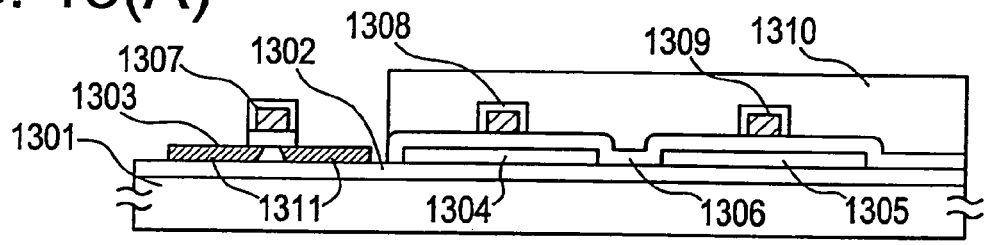
FIGS. 13(A) to 13(F) show the stages of manufacture of the thin film transistor of an 8th example.
Figure 13B:
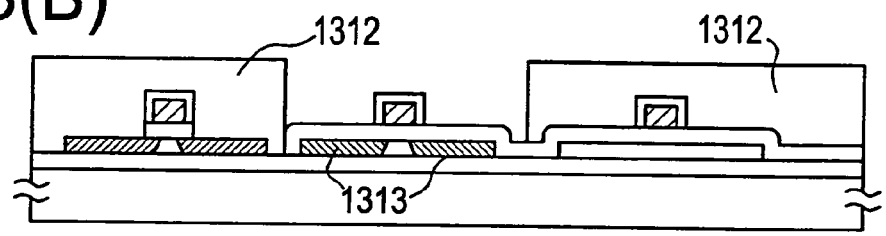
Figure 13C:
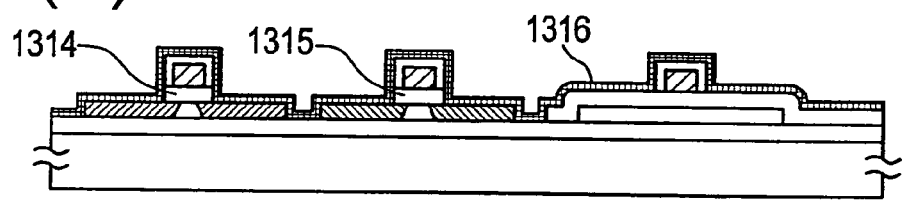
Figure 13D:
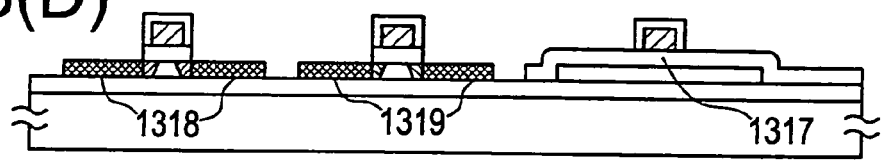
Figure 13E:
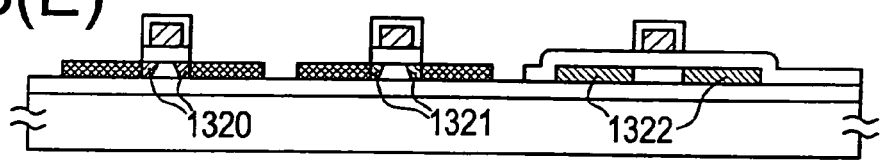
Figure 13F:
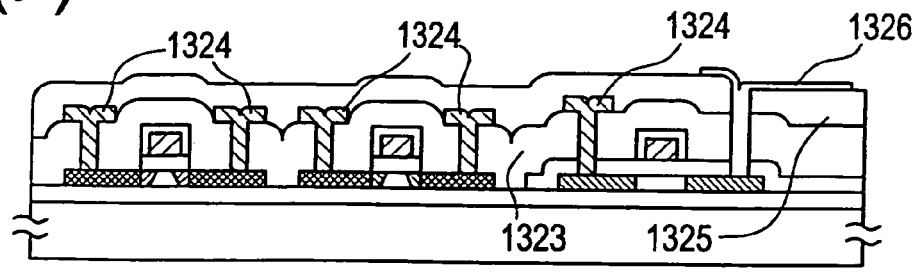
Figure 14A:
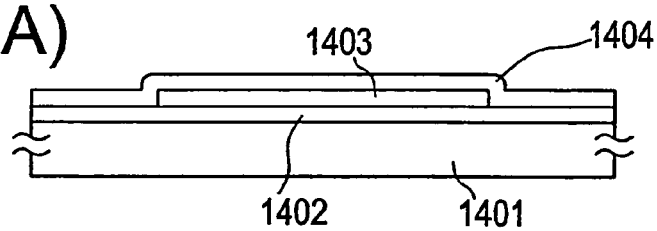
FIGS. 14(A) to 14(G) show the stages of manufacture of another thin film transistor according to a conventional method.
Figure 14B:
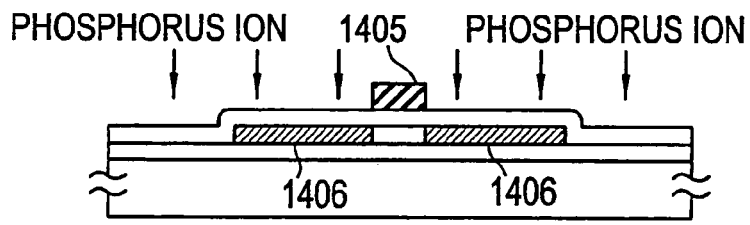
Figure 14C:
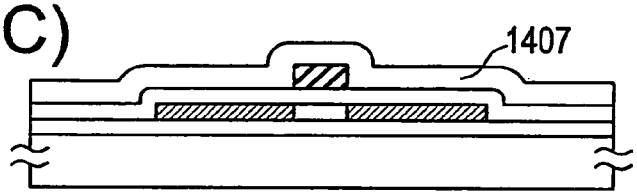
Figure 14D:
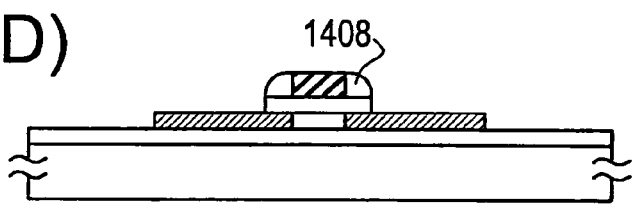
Figure 14E:
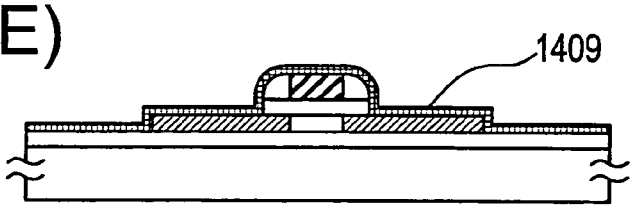
Figure 14F:
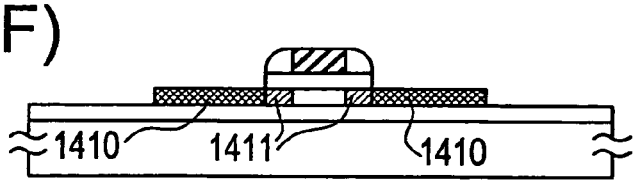
Figure 14G:
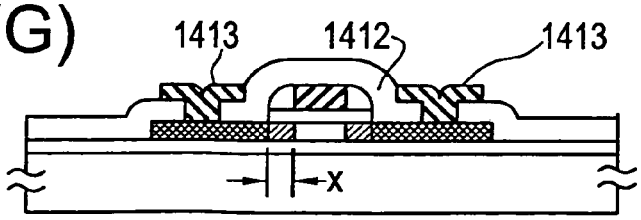
Figure 15A:
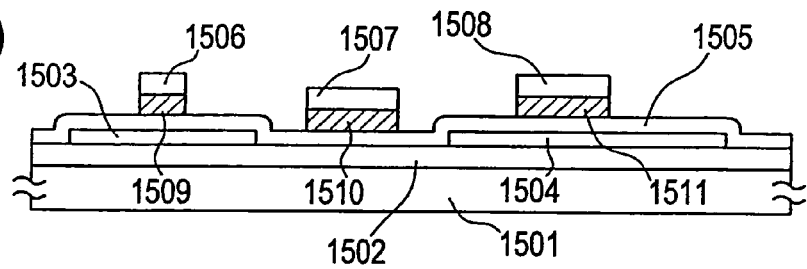
FIGS. 15(A) to 15(G) show the stages of manufacture of the thin film transistor of a 9th example.
Figure 15B:
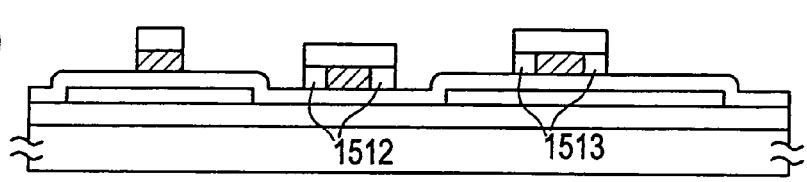
Figure 15C:
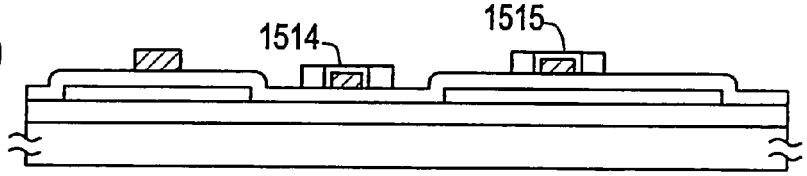
Figure 15D:
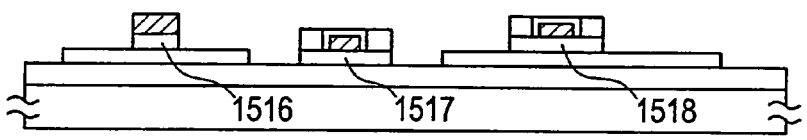
Figure 15E:
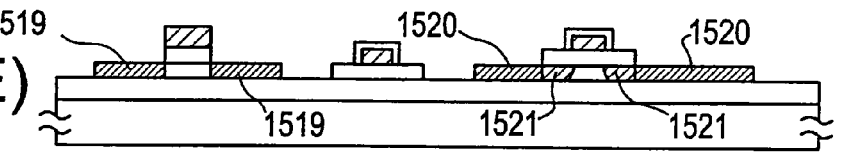
Figure 15F:
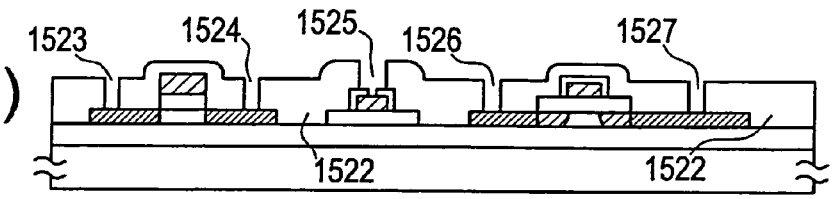
Figure 15G:
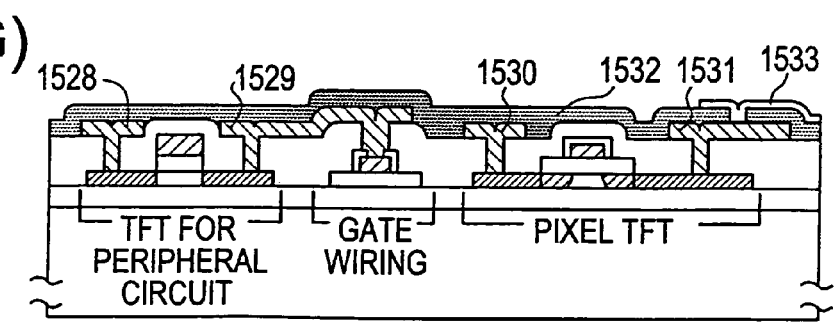

Next, the exposed gate insulation film 305 was removed, so producing the state shown in FIG. 9(D). Further, a metal film 800 was formed by a sputtering process to a thickness of 50-500 Å. In this case, a titanium film was formed, by a sputtering process, to a thickness of 200 Å as the metal film 800. Metal material such as nickel, molybdenum, tungsten, platinum or palladium etc. can be used instead of a titanium film.

Then, irradiation with laser light (eg, a KrF excimer laser) was effected, thereby activating the impurity with which doping had been effected and recrystallizing the low-concentration impurity regions, and, also, forming a metal silicide layer 803 (in this case, a titanium silicide layer) at and in the vicinity of the interface of the metal film 800 and the active layer. When a KrF excimer laser is used, it is satisfactory if the laser light irradiation density is 250-300 mJ/cm$^2$. Also, it is effective if the sample material is heated to 200-500° C. during laser heating. Also, intense light may be used instead of laser light. (FIG. 9 (E))

After formation of the metal silicide layer 803, the metal film 800 was etched with an etching solution constituted by a 5:2:2 mixture of hydrogen peroxide, ammonia and water. A silicon oxide film 311 was then formed to a thickness of 6000 Å as a layer insulation film. Further, contact holes for the TFT's source and drain were formed in a hole-opening stage. Then, an aluminum film was formed by a sputtering process, and was patterned to define source/drain electrodes 312. (FIG. 9(F))

The above process resulted in production of a TFT possessing an N-channel LDD. Formation of the TFT may be further followed by hydrogenation at 200-400° C. for the purpose of activating the impurity regions. The TFT shown in FIG. 9(E) has a structure in which 310 functions as a region that eases the field concentration between the channel-forming region and the source and drain regions.

EXAMPLE 7

The example is shown in FIG. 12, and it is one in which an N-channel TFT and a P-channel TFT are formed on one and the same substrate according to the invention. In this example, a silicide of the invention was used only for the N-channel TFT.

First, silicon oxide was formed to a 1000-5000 Å, eg, 1000 Å film by a plasma CVD process to constitute a base oxide film 1202 on a substrate 1201 (Corning 7059, 100 mm×100 mm). This silicon oxide film serves to prevent diffusion of impurities from the glass substrate.

Then, an amorphous silicon film 1203 for defining an active layer was formed to a thickness of 300-1500 Å, eg, 500 Å by a plasma CVD process. After that, crystallization was effected by leaving this material in a reducing atmosphere at 550-600° C. for 8-24 hours. There is no objection if a small amount of a catalyst element such as nickel, etc. for promoting crystallization is added at this time. The crystallinity of the silicon film that had thus been crystallized was improved still further by irradiating it with a KrF excimer laser (wavelength 248 nm). The laser energy density depends on the silicon film's crystallinity, but good results were achieved with 200-350 mJ/cm$^2$. The optimum energy density also depended on the substrate temperature during laser irradiation. (FIG. 12(A))

Next, the resulting crystalline silicon film 1203 was patterned to define silicon films 1204 and 1205 in the form of islands. These island-shaped silicon films constituted TFT active layers. Then, a 200-1500 Å, eg, 1200 Å thick silicon oxide film was formed as a gate insulation film 1206 by a plasma CVD process.

After that, a 1000 Å-3 µm, eg, 6000 Å thick film of aluminum (containing 1 wt % of Si or 0.1-0.3 wt % of Sc) was formed by a sputtering process, and was patterned to define gate electrodes 1207 and 1208. Next, the substrate was immersed in a 1-3% ethylene glycol solution of tartaric acid adjusted to pH is approximately 7.1 by ammonia, and anodic oxidation was effected, with the aluminum electrodes 1207 and 1208 as anodes and with platinum as a cathode, so forming anodic oxidation products 1209 and 1210. For the anodic oxidation, the voltage was first raised to a specific voltage, with the current constant, and the process was completed by maintaining this state for 1 hour. The specific voltage is determined in accordance with the thickness of the anodic oxidation products 1209 and 1210. In the above anodic oxidation process, the thickness of the anodic oxidation products is approximately proportional to the maximum voltage imposed. In this manner, 600-2500 Å, eg, 1200 Å thick anodic oxidation products 1209 and 1210 were formed. The maximum imposed voltage in this process was 80-90 V. (FIG. 12(B))

Next, the region in which a P-channel TFT was to be formed was covered with a photoresist mask 1211, and the silicon oxide film in the N-channel TFT region was etched, with the gate electrode and anodic oxidation product serving as a mask. Only the region for the N-channel region was etched, and the region for the P-channel region was not etched, since it was covered by the mask 1211.

A dry etching procedure was used for the etching, and CHF$_3$ was used as the etching gas in this process. This is preferable since aluminum oxide constituting the anodic oxidation product is hardly etched at all by dry etching, and so there is selective etching of only the silicon oxide film. Needless to say, a wet etching procedure, too, may be used, but if, for example, a hydrogen fluoride based etchant (eg, a mixed solution of hydrofluoric acid and ammonium fluoride) is used, care is needed, since in this case the anodic oxidation product (aluminum oxide) can be etched too. In this manner, the active layer of the N-channel TFT was exposed.

Then, phosphorus was introduced at a low concentration into the region for forming the N-channel TFT. At this time, low-dose doping was effected by the rotation-tilt ion implantation procedure illustrated in FIG. 1. The angle of incidence for the ion implantation at this time was large, so as to cause the low-concentration impurity region to be formed as far as underneath the gate electrode portion, and the acceleration voltage, too, was large. The dose in this example was $1\times10^{13}$-$5\times10^{14}$ atoms/cm$_2$, and the acceleration voltage was 60-120 kV, eg, a dose of $4\times10^{13}$ atoms/cm$^2$ and an acceleration voltage of 110 kV. As a result of this, low-concentration N-type impurity regions 1212 were formed, and these regions were so formed that they overlapped the gate electrode 1207. (FIG. 12(C))

This stage may be followed by doping with phosphorus at a higher dose from a generally vertical direction, as illustrated in FIG. 11. After completion of doping, the photoresist mask 1211 covering the P-channel TFT region was removed, and a 5-50 nm thick titanium film 1009 was formed by a sputtering procedure. (FIG. 12(D))

Then, annealing was effected for 1 hour at 300-550° C., eg, 350° C. As a result of this, a silicide was formed in the portions where the titanium film and the silicon film were in close contact, but as the titanium film and the silicon oxide and aluminum oxide did not react, these portions of the titanium film remained unreacted. The unreacted titanium film was removed by an aqueous solution of hydrogen peroxide, water and ammonia, eg, an etchant with the proportions hydrogen peroxide: ammonia:water=5:2:2. In this manner, silicide regions 1215 corresponding to the N-channel TFT's source and drain were formed. Those portions of the low-concentration N-type impurity regions 1212 which had not become a silicide remained as regions 1214 in the gate electrode portion.

Next, the region constituting the N-channel TFT was covered with a photoresist mask 1216, and boron was introduced into the P-channel TFT region. In this case, the impurity ions were injected generally vertically, and the dose was $1\times10^{13}$-$5\times10^{15}$ atoms/cm$^2$, and the acceleration voltage was 5-80 kV, eg, a dose of $1\times10^{15}$ atoms/cm$^2$ and an acceleration voltage of 65 kV. This resulted in formation of P-type impurity regions 1217 (source/drain regions). (FIG. 12(E))

Then, with the gate electrode 1208 and anodic oxidation product 1210 serving as a mask, the silicon oxide film 1206 of the P-channel region was again etched by dry etching procedure. This etching was effected in order to make the N-channel TFT and P-channel TFT contact holes the same depth.

After that, the impurity regions 1214 and 1217 were activated by irradiation with an XeCl excimer laser (wavelength 308 nm, pulse width 30 nsec) from the rear surface. The laser energy density was suitably 200-400 mJ/cm$^2$, and was preferably 250-300 mJ/cm$^2$. This stage may also be performed by thermal annealing. (FIG. 12(F))

The reason for using an XeCl excimer in this example is that if a shorter wavelength laser were used, the laser light would be absorbed by the substrate (Corning 7059) and fail to reach the TFT's. A KrF excimer laser (wavelength 248 nm) may be used if quartz is used for the substrate. Also, in cases in which, as in this example, borosilicate glass such as Corning 7059 is used, it is more effective if an XeF excimer laser, which has a longer wavelength (353 nm), is used.

Next, a silicon oxide film was formed to a thickness of 3000 Å by a plasma CVD process to constitute a layer insulation film 1218. Then, the layer insulation film 1218 was etched to form TFT source/drain contact holes. Then, an aluminum film was formed by sputtering and was patterned and etched to define source/drain electrodes 1219. (FIG. 12(G))

In this example, the N-channel TFT is a structure in which the low-concentration impurity regions are caused to overlap the gate electrode. This is because, especially in an N-channel TFT, there is a problem that the conduction of the drain current is hindered by a parasitic P-type channel that is produced as the result of hot electrons being trapped in the gate insulation film (something which is particularly marked when the maximum process temperature is $\leq 700°$ C.), but an effective measure to prevent formation of this parasitic channel is to make the impurity regions an overlap structure as described above.

EXAMPLE 8

This example is shown in FIG. 13 and it is one that relates to a monolithic active matrix circuit in which an active matrix circuit that is used in a liquid crystal display, etc. and a peripheral circuit for driving it are formed on one and the same substrate. In this example, a complementary circuit which was produced by using the invention and consisted of an N-channel TFT and a P-channel TFT using a silicide was used for the peripheral circuit, for which high-speed operation is demanded, and a P-channel TFT with a low-concentration source and drain was used as an active matrix circuit switching element. Use of the invention for the peripheral circuit as in this example lowers the sheet resistance of (the region corresponding to) the source and drain and is effective in respect of high-speed operation.

The manufacturing stages in this example will now be described with reference to FIG. 13. First, similarly to Example 1, and silicon oxide film was formed to 2000 Å on a substrate 1301 (Corning 7059) by a plasma CVD process to constitute a base oxide film 1302. Then, an amorphous silicon film for constituting an active layer was formed to 500 Å, and was crystallized in the same way as in Example 1, and it was then etched to define silicon regions 1303, 1304 and 1305 in the form of islands. These island-shaped silicon regions constituted TFT active layers. Further, a 1200 Å thick silicon oxide film 1306 was formed as a gate insulation film by a plasma CVD process.

After that, gate electrodes 1307, 1308 and 1309 were formed by 5000 Å thick aluminum films. 1000 Å thick anodic oxide coverings were formed on the top and side surfaces of the gate electrodes.

After that, the peripheral circuit P-channel TFT region and the active matrix circuit were covered with a photoresist mask 1310, and, with this as a mask, the silicon oxide film 1306 of the peripheral circuit N-channel TFT was etched by a dry etching procedure.

Following this, an N-type impurity was introduced into the island-shaped silicon region 1303 in a self-aligning manner, with the gate electrode portion as a mask, by an ion doping procedure. In this example, doping was effected with phosphorus. A rotation-tilt ion doping procedure was used for this doping. The dose was $1 \times 10^{13}$-$5 \times 10^{14}$ atoms/cm$^2$, and the acceleration voltage was 60-120 kv, eg, a dose of $3 \times 10^{14}$ atoms/cm$^2$ and an acceleration voltage of 120 kV. This resulted in the formation of N-type impurity regions 1311 in the source and drain of the peripheral circuit N-channel TFT. (FIG. 13(A))

Next, the photoresist mask 1310 covering the P-channel TFT region was removed, and photoresist masks 1312 were formed covering the peripheral circuit N-channel TFT region and the active matrix circuit region. Then, using these masks, doping with a P-type impurity (boron in this case) was effected, again by rotation-tilt ion doping procedure, so forming P-type impurity regions 1313. The dose in this case was $1 \times 10^{13}$-$5 \times 10^{15}$ atoms/cm$^2$, and the acceleration voltage 40-90 kV, eg, a dose of $3 \times 10^{14}$ atoms/cm$^2$ and an acceleration voltage of 70 kV. (FIG. 13(B))

After that, using the masks 1312, the silicon oxide film 1306 of the P-channel TFT region was etched. As a result, therefore, the state was one in which, in the peripheral circuit region, the silicon oxide film 1306, apart from the silicon oxide films 1314 and 1315 below the gate electrode portions, had been etched away, and the active layer in all the portions corresponding to the TFT source/drain regions was exposed. After that, the photoresist masks 1312 covering the P-channel TFT region were removed, and a 5-50 nm thick titanium film 1316 was formed by a sputtering procedure. (FIG. 13(C))

Then, silicide regions 1318 and 1319 were formed by reacting the titanium film and the silicon film by annealing for 1 hour at 300-550° C., eg, 350° C. Unreacted titanium film was removed by an aqueous solution of hydrogen peroxide, water and ammonia, eg, an etchant with the proportions hydrogen peroxide:ammonia:water=5:2:2. Consequently, a silicide was formed in the peripheral circuit TFTs, but no silicide was formed in the active matrix circuit, since its silicon active layer was covered by the silicon oxide film 1306. (FIG. 13(D))

Those portions of the impurity regions 1311 and 1313 which had not become a silicide remained as regions 1320 and 1321 in the gate electrode portions. After that doping with a P-type impurity (boron in this case) at a low concentration was effected, so forming low-concentration P-type impurity regions 1322. For the doping this time, impurity ions were injected generally vertically. The dose in this case was $1 \times 10^{12}$-$5 \times 10^{14}$ atoms/cm$^2$, and the acceleration voltage was 40-90 kV, eg, a dose of $3 \times 10^{13}$ atoms/cm$^2$ and an acceleration voltage of 65 kV. Since the actual dose in this doping was very small, there was almost no effect on the peripheral circuit. (FIG. 13(E))

After that, the doped impurity regions were activated by irradiation with an XeCl excimer laser (wavelength 353 nm) via the rear surface. The laser energy density was suitably 200-400 mJ/cm$^2$, and was preferably 250-300 mJ/cm$^2$.

Next, a silicon oxide film was formed to a thickness of 3000 Å by a plasma CVD process to constitute a layer insulation film 1323. Then, contact holes for the TFT sources and drains were formed by etching the layer insulation film 1323 and the gate insulation film 1306. Then, an aluminum film was formed by sputtering, and was patterned to define source/drain electrodes 1324.

After that, a silicon nitride film was formed to a thickness of 3000 Å by a plasma CVD process to constitute a passivation film 1325, and this and the layer insulation film 1323 and gate insulation film 1306 were etched to form a contact hole, and a pixel electrode 1326 was constituted by a transparent conductive film on the active matrix circuit TFT. (FIG. 13(F))

The above stages produced a monolithic active matrix circuit in which a circuit which was produced using the invention and which consisted of an N-channel TFT and a P-channel TFT with a silicide in the regions corresponding to the source and drain was used in the peripheral circuit, and a P-channel TFT with a lightly doped source and drain was used as an active matrix circuit switching element. The reason why silicide regions were provided only in the peripheral circuit in this example is as described earlier. The reasons for making the source/drain regions in the active matrix circuit TFT lightly doped regions as described above are that doing this achieves further reduction of leakage current and, also, it has outstanding effects in respect of reduction of deterioration caused by hot carriers on imposition of a reverse bias voltage (a positive voltage in the case of a P-channel TFT) on the gate electrode.

EXAMPLE 9

This example is also a monolithic active matrix circuit for a liquid crystal display. The manufacturing stages in this example are shown in FIG. 15. A CMOS circuit was used for the peripheral circuit in this example, but, for simplicity only NTFTs are shown as the peripheral circuit TFTs in FIG. 15. The peripheral logic circuit is representatively shown on the left side in FIG. 15, and the matrix circuit on the right.

A 2000 Å thick silicon oxide base film 202 was formed by a plasma CVD process on a glass substrate 1501. Monosilane ($SiH_4$) and nitrous oxide ($N_2O$) were used as the source gases in the plasma CVD process, and the substrate temperature at the time of film formation was 380-500° C., eg, 430° C. The silicon oxide film 1502 thus formed was a hard film whose etching rate was comparatively low. This is because nitrous oxide was used as a source gas, and consequently the film became a silicon oxide film containing 1-10% of nitrogen. A typical etching rate in etching at 23° C. by acetic-acid-buffered fluoric acid (ABHF) with hydrofluoric acid, ammonium fluoride and acetic acid in the proportions 1:50:50 was 800-1100/minute.

After that a 500 Å thick amorphous silicon film was formed by a plasma CVD process. Further, a very thin silicon oxide film (estimated to be 40-100 Å) was formed on the surface of this amorphous silicon film by annealing for 1 hour at 550° C. in an oxidizing atmosphere. Then, a very thin film 45 of nickel acetate was formed by a spin coating procedure. A 1-100 ppm nickel acetate aqueous solution was used for this procedure. The purpose of forming a thin silicon oxide film on the surface of the amorphous silicon film beforehand was to cause the aqueous solution to spread uniformly over the amorphous silicon surface.

Next, thermal annealing was effected for 4 hours at 550° C. in a nitrogen atmosphere. Nickel acetate decomposes to give nickel at around 400° C. and since the nickel acetate thin film was, effectively, in close attachment to the amorphous silicon, this thermal annealing stage resulted in nickel penetrating into the amorphous silicon and causing it to crystallize, so producing a crystalline silicon region.

After that, the silicon film was irradiated with an XeCl excimer laser (wavelength 308 mm). In this example, the laser's energy density was 250-300 mJ/cm². As a result, the crystallinity of the crystalline silicon was improved still more.

Further, thermal annealing was effected again, in order to relieve the strain caused by the stress of laser irradiation. In this example, the thermal anneal was performed for 4 hours at 550° C.

After that, the silicon film was etched, to form active layers 1503 and 1504 in the form of islands. Then, a 1200 Å thick silicon oxide film 1505 was formed as a gate insulation film by a sputtering procedure.

Further, a 4000 Å thick aluminum film (containing 0.2-0.3 wt % of scandium) was formed by a sputtering procedure. Then, by anodic oxidation of the surface of this film, a 100-300 Å thick aluminum oxide film (not shown in the drawing) was formed. The presence of the aluminum oxide film made adhesion with a photoresist good and, through suppression of leakage of current from the photoresist, it was effective in causing a porous anodic oxide to be formed only on the side surface in a subsequent anodic oxidation stage.

Then, a photoresist (eg, OFPR800/30 cp manufactured by Tokyo Oka) was formed by a spin coating procedure, and was patterned and etched to define gate electrodes 1509 and 1511 and a gate line 1510. The peripheral circuit gate electrode 1509 and gate line 1510, and matrix circuit gate electrode 1511 were electrically insulated. The photoresist masks 1506, 1507 and 1508 that were used in the etching were left as they were. (FIG. 15(A))

Next, with the photoresist masks still attached, porous anodic oxidation was effected by passing current through the gate line 1510 (and hence the gate electrode 1511), so forming on the side surfaces of this gate line and gate electrode porous anodic oxidation products 1512 and 1513. The anodic oxidation was effected using a 3-20% acidic aqueous solution of citric acid, oxalic acid, phosphoric acid, chromic acid or sulfuric acid, etc. It is satisfactory if a constant-current voltage of 10-30 V is imposed on the gate electrode.

In this example, anodic oxidation was effected for 20-40 minutes in a pH=0.9-1.0 oxalic acid solution (30° C.), with the voltage 10 V. The anodic oxide thickness was controlled by means of the anodic oxidation time. When anodic oxidation is effected in an acidic solution such as the above, a porous anodic oxide is formed. In this example, the thickness of the porous anodic oxidation products 1512 and 1513 was 3000-10000 Å, eg, 5000 Å. (FIG. 15(B))

Next, the photoresist masks were peeled off, and barrier type anodic oxidation was effected by passing current through the gate line 1510, so forming fine barrier anodic oxide coverings 1514 and 1515 to a thickness of 1200 Å on the side surfaces and top surfaces of the gate line and gate electrode. (FIG. 15(C))

Next, with the porous anodic oxidation products 1512 and 1513 as masks, the silicon oxide film 1505 was etched by a dry etching procedure, so resulting in formation of gate insulation films 1517 and 1518. This etching may be effected either in isotropic etching plasma mode or in anisotropic etching reactive ion etching mode. However, it is important that the silicon and silicon oxide selection ratio be made sufficiently great to avoid excessive etching of the active layer. For example, if $CF_4$ is used as the etching gas, the anodic oxidation product is not etched, and only the silicon oxide film 1505 is etched. Also, the silicon oxide films 1517 and 1518 below the porous anodic oxidation products 1512 and 1513 remained unetched. (FIG. 15 (D))

Further, a mixed solution (aluminum mixed acid) of phosphoric acid, acetic acid and nitric acid was used to etch only the porous anodic oxidation products. The porous anodic oxidation products were etched by the aluminum mixed acid, but the barrier anodic oxide coverings 1514 and 1515 were hardly etched at all by it. However, since aluminum was being etched, the peripheral circuit portion was masked with a photoresist, in order to protect its gate electrodes. Therefore, although a photolithography stage is added, there is the advantage that the level of integration of the peripheral circuit portion can be raised.

Then, using the gate insulation film, impurities (phosphorus and boron; although the drawing shows only an NMOS, in actual fact boron doping was also effected) were introduced into the active layer by an ion doping procedure. To take phosphorus doping as an example, first, phosphorus ions were injected from the vertical direction at the comparatively high dose of $5\times10^{14}$-$5\times10^{15}$ atoms/cm² and the comparatively low acceleration voltage of 10-30 keV. Since the acceleration voltage was low in this process, the depth of ion penetration was shallow, and the phosphorus was implanted mainly in the regions 1519 and 1520 where silicon was exposed.

Figure 2A:
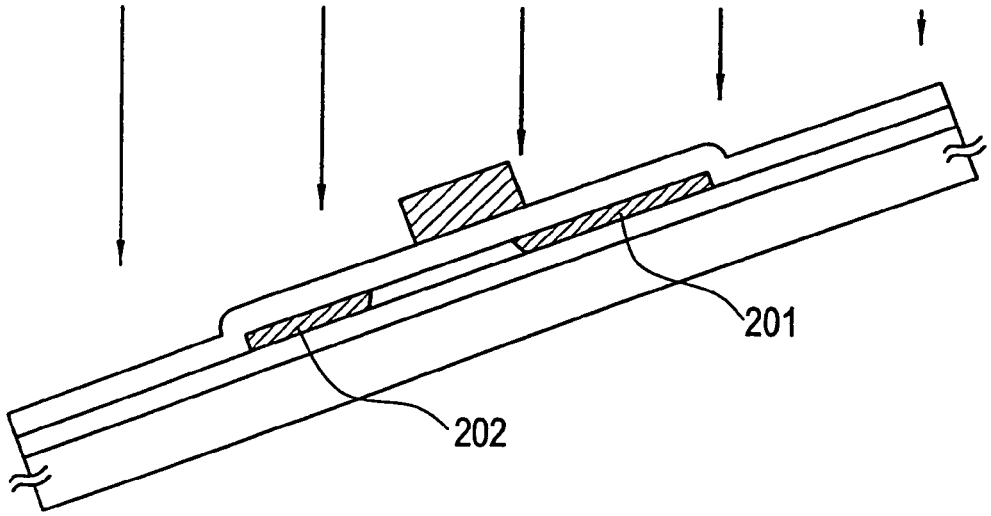
FIGS. 2(A) to 2(C) illustrate the concept of tilt ion implantation.
Figure 2B:
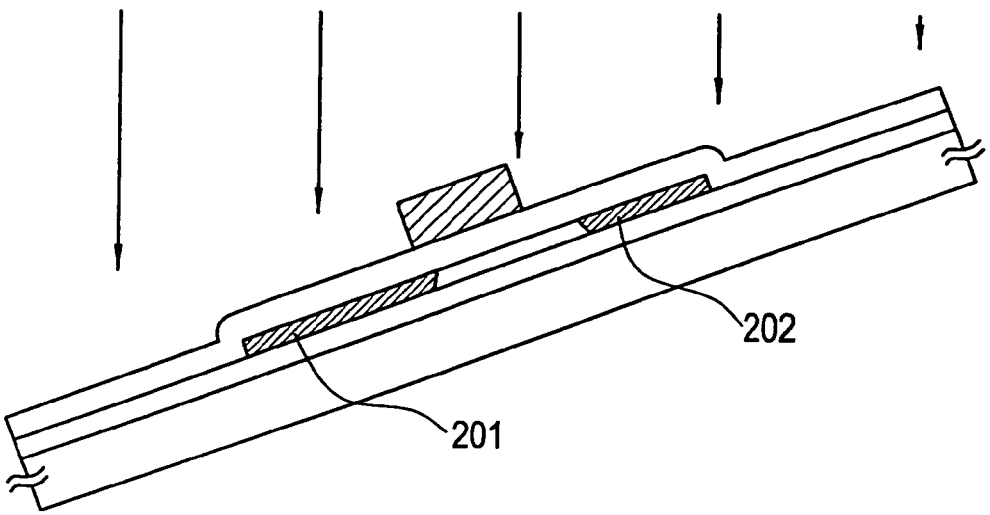
Figure 2C:
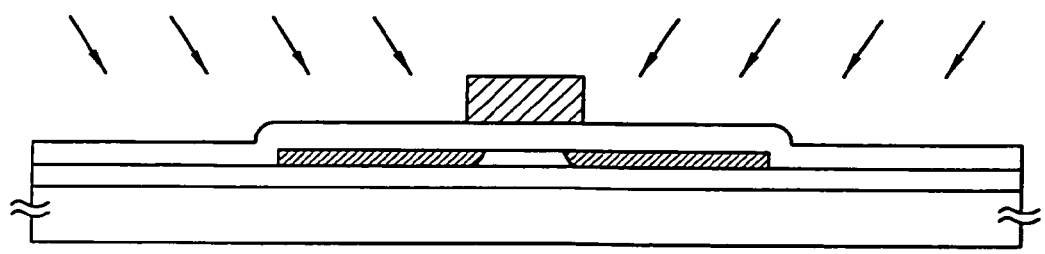
Figure 3A:
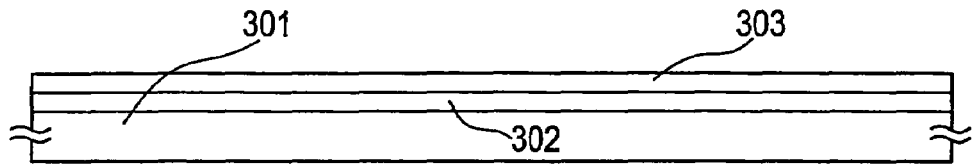
FIGS. 3(A) to 3(E) show the stages of manufacture of the thin film transistor of a 1st example.
Figure 3B:
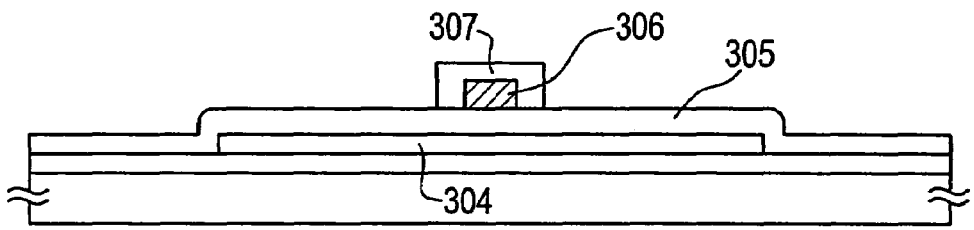
Figure 3C:
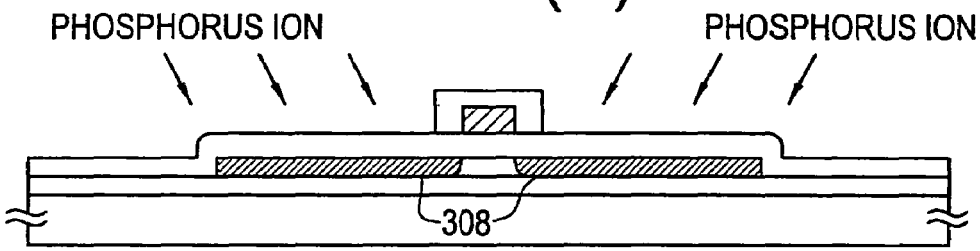
Figure 3D:
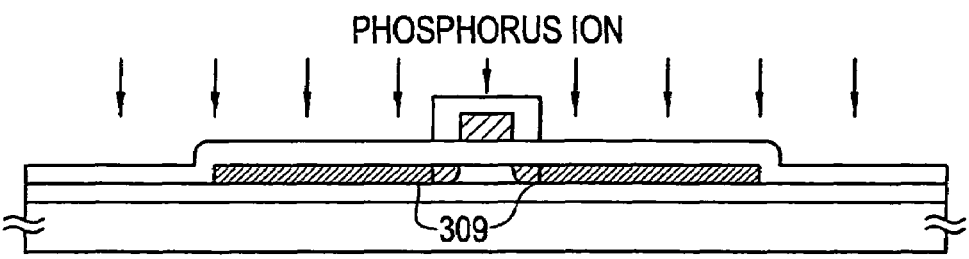
Figure 3E:
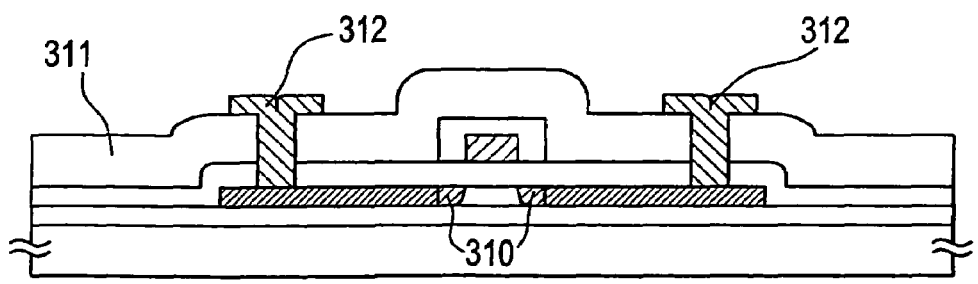
Figure 4A:
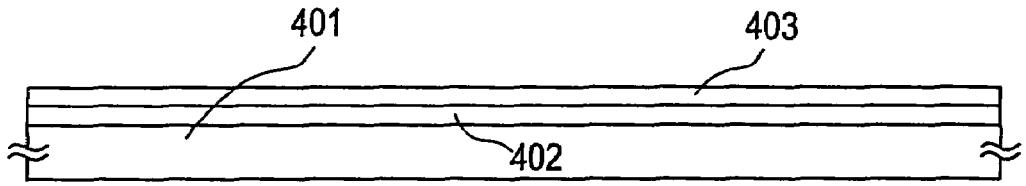
FIGS. 4(A) to 4(E) show the stages of manufacture of the thin film transistor of a 2nd example.
Figure 4B:
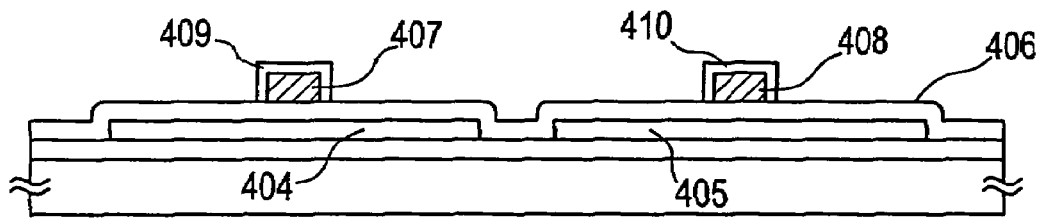
Figure 4C:
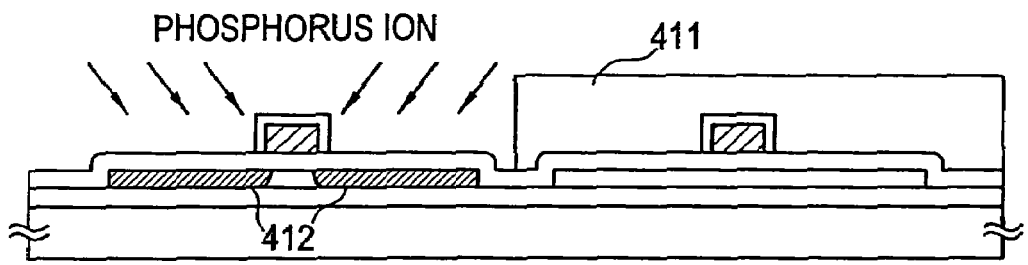
Figure 4D:
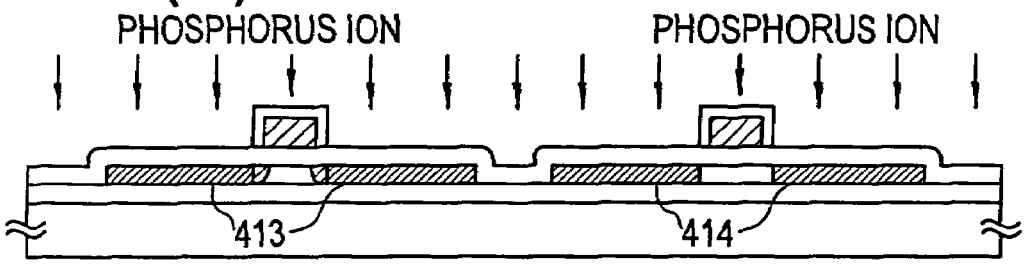
Figure 4E:
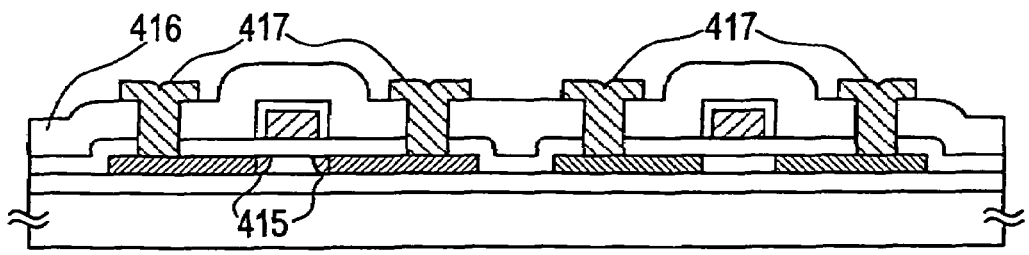
Figure 5A:
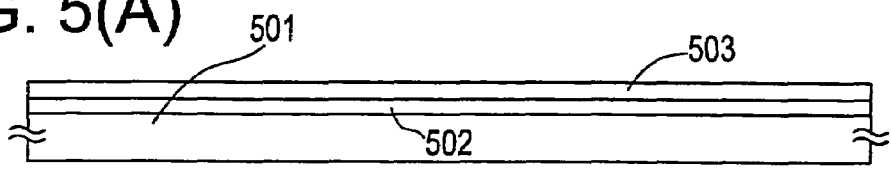
FIGS. 5(A) to 5(F) show the stages of manufacture of the thin film transistor of a 3rd example.
Figure 5B:
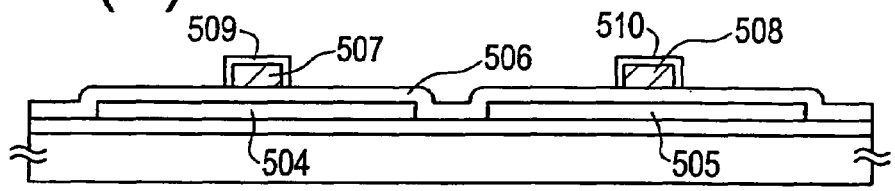
Figure 5C:
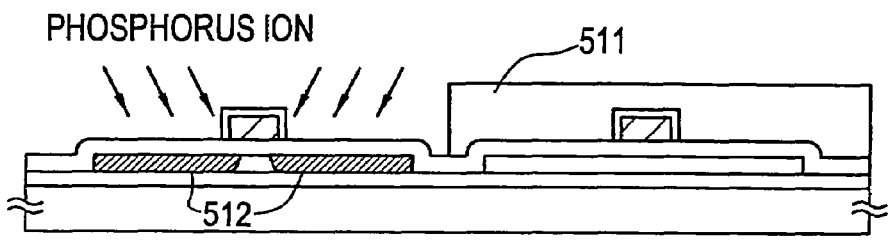
Figure 5D:
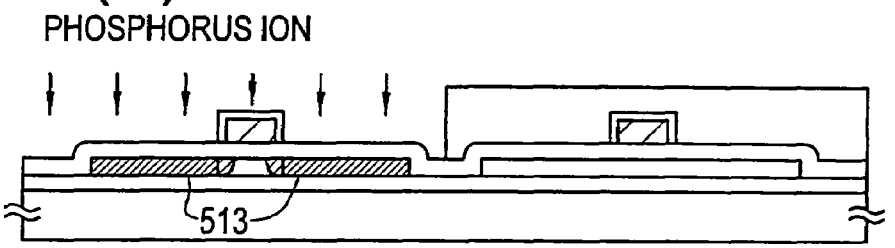
Figure 5E:
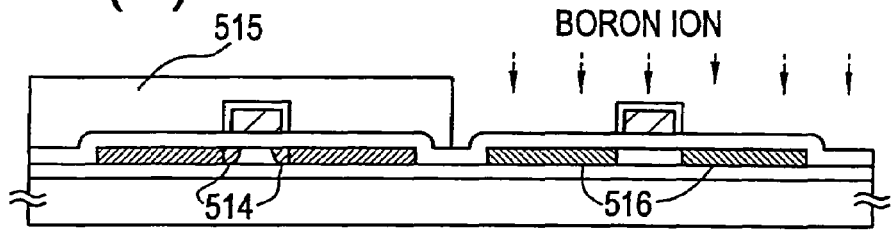
Figure 5F:
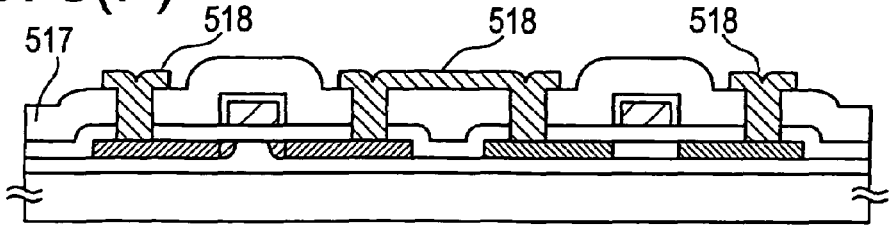
Figure 6A:
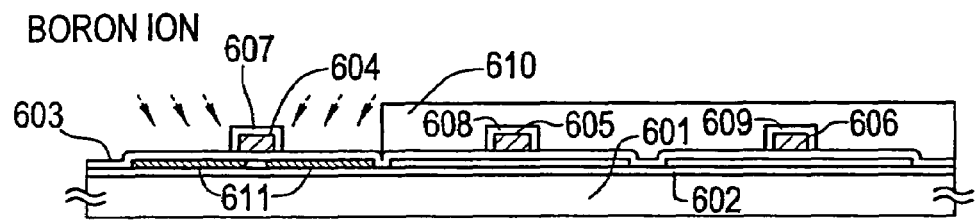
FIGS. 6(A) to 6(F) show the stages of manufacture of the thin film transistor of a 4th example.
Figure 6B:
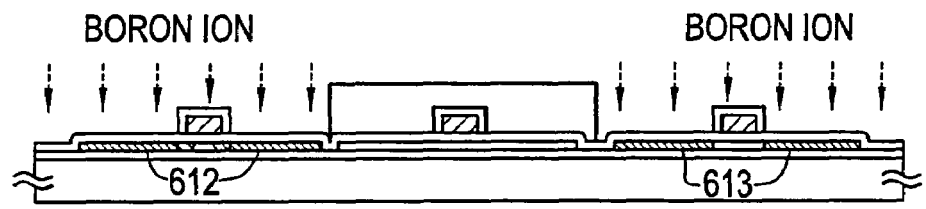
Figure 6C:
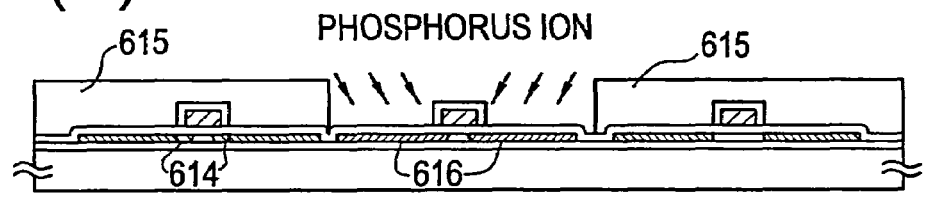
Figure 6D:
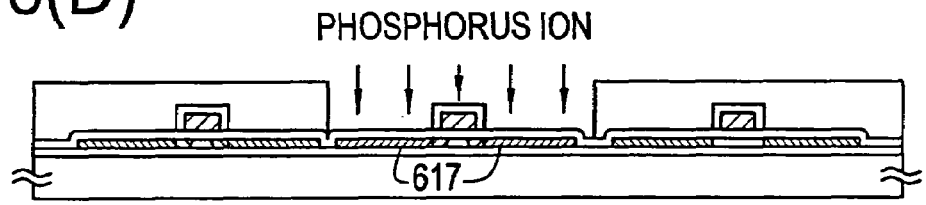
Figure 6E:
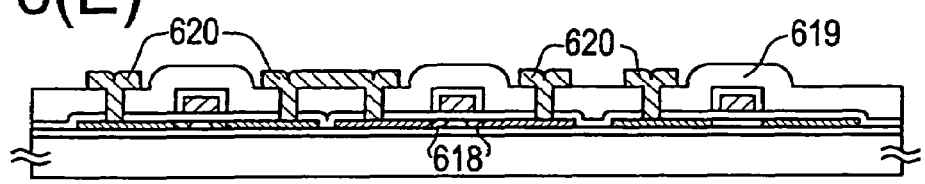
Figure 6F:
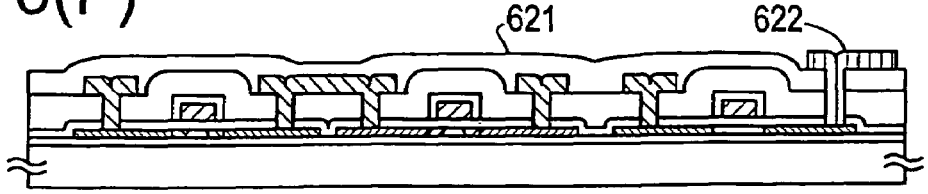
Figure 7A:
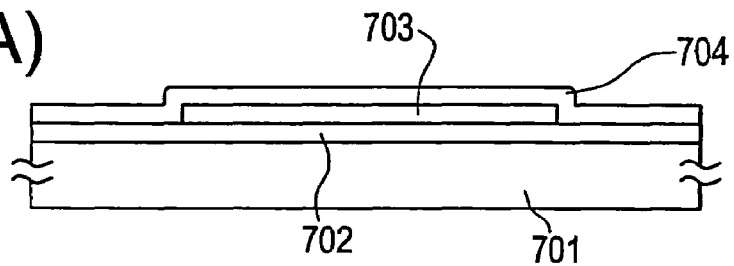
FIGS. 7(A) to 7(F) show stages in a conventional method.
Figure 7B:
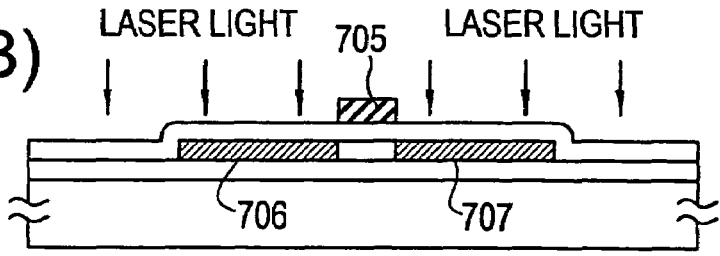
Figure 7C:
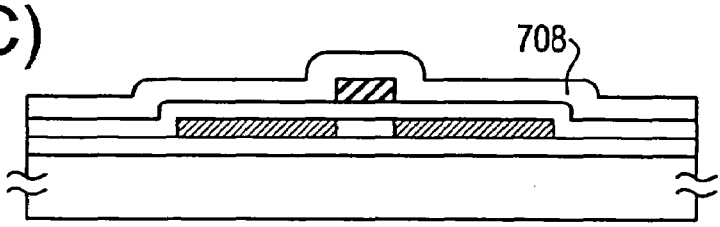
Figure 7D:
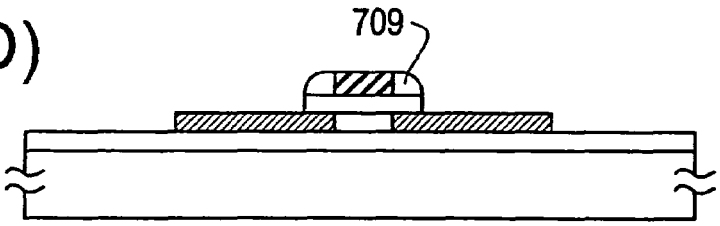
Figure 7E:
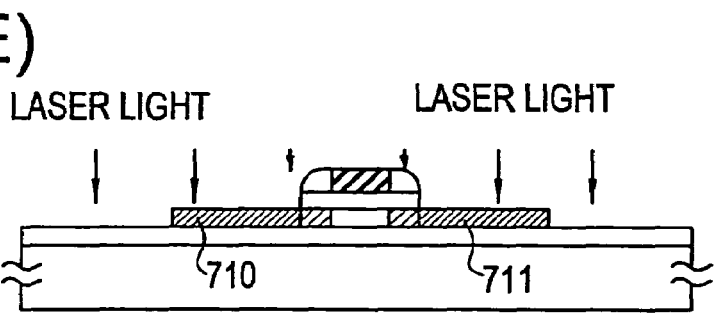
Figure 7F:
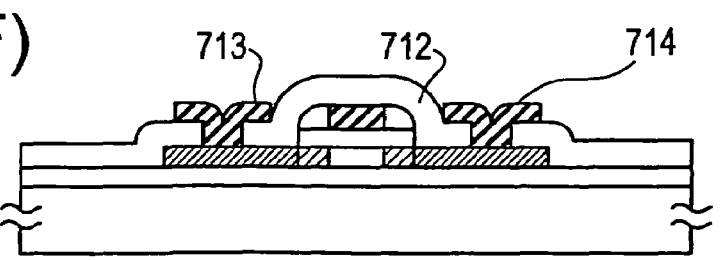

Next, using the apparatus shown in FIG. 1, phosphorus ions were implanted at a comparatively low dose by the rotation-tilt ion implantation procedure illustrated in FIG. 2. In this case, the acceleration voltage was comparatively high, and was 60-95 keV, and the dose was $1\times10^{12}$-$1\times10^{14}$ atoms/cm$^2$. Because the acceleration voltage was high this time, the ions penetrated deeply, and phosphorus was also implanted in the regions 1521 covered by the gate insulation film.

As a result, there were formed regions 1519 and 1520 doped with phosphorus at a high concentration and regions 1521 doped with phosphorus at a low concentration. In other words, a so-called double drain structure was produced for the pixel TFT. The same procedure should also be employed for boron. After that, irradiation with a KrF excimer laser (wavelength 248 nm, pulse width 20 nsec) was effected in order to improve the crystallinity of the portions whose crystallinity had deteriorated because of the formation of the above-noted impurity regions. The laser energy density was suitably 200-400 mJ/cm$^2$, and was preferably 250-300 mJ/cm$^2$. (FIG. 15(E))

A multilayer film 1522 consisting of a 200 Å thick silicon oxide film and a 4000 Å thick silicon nitride film was deposited as a 1st layer insulator by a plasma CVD process, and was etched by a dry etching procedure to form contact holes 1523, 1524, 1525, 1526 and 1527. (FIG. 15(F)) Then, a titanium 500 Å/aluminum 4000 Å/titanium 500 Å 3-layer metal film was deposited by a sputtering procedure, and was etched to form electrode/wiring 1528, 1529, 1530 and 1531.

Further, a 2000 Å thick silicon oxide film 1532 was deposited as a 2nd layer insulator by a plasma CVD process, a contact hole to the electrode 1531 on the pixel TFT's drain side was formed, and a pixel electrode 1533 was formed with ITO. In this manner, formation of a monolithic active matrix circuit was completed. (FIG. 15(G))

Conventionally, an LDD region is formed by forming a sidewall adjacent the side surface of a gate electrode after formation of a low-concentration impurity region, but with this procedure, since formation of a sidewall is difficult and takes time and effort, the yield is low and there are problems in terms of productivity. In the present invention, the arrangement is made such that formation of a sidewall is not necessary, but a TFT possessing an LDD can easily be formed, simply by introducing an impurity at a low concentration from an oblique direction and an impurity at a high concentration from the vertical direction in ion doping stages in ordinary TFT manufacture, and the invention is therefore advantageous from the point of view of improving yields.

Further, by controlling the angle of incidence for impurity injection at the time of formation of a low-concentration impurity region in a TFT possessing a gate electrode covered by an oxide covering, it is possible to produce a TFT with a structure which has an LDD only under the oxide covering, or a TFT with an overlap LDD structure.

Further, since the greater portion of the impurity region corresponding to the source/drain region can be made as a silicide, the sheet resistance of this region can be lowered. It is noted that, although practice of the invention necessitates the addition of an anodic oxidation stage, the anodic oxide coverings produced give the advantage that the insulation between wiring is reinforced. Also, in the invention, controllability of N-type or P-type impurity regions can be made very much better than it is with conventional methods, and so the probability of occurrence of faulty parts can be greatly reduced.

Thus, use of the invention disclosed in this Specification makes it possible for thin film transistors possessing required characteristics to be produced with good productivity and at high yields.

What is claimed is:

1. A display device comprising:
   an active layer and a gate electrode formed over the active layer with a gate insulating film interposed therebetween, wherein the active layer contains a pair of impurity regions and a lightly doped region which contains an impurity concentration less than that of the pair of impurity regions;
   a first interlayer insulating film formed over the gate electrode, wherein the first interlayer insulating film contains silicon oxide film and silicon nitride film;
   a wiring formed over the first interlayer insulating film and electrically connected to one of the pair of impurity regions through a first contact hole formed in the first interlayer insulating film;
   a second interlayer insulating film formed over the wiring and the first interlayer insulating film; and
   a pixel electrode formed over the second interlayer insulating film and electrically connected to the wiring through a second contact hole formed in the second interlayer insulating film,
   wherein a perpendicular line extending from a center of the first contact hole and a perpendicular line extending from a center of the second contact hole are not aligned with each other,
   wherein the one of the pair of impurity regions is wider than the other one of the pair of impurity regions, and
   wherein the gate electrode overlaps the lightly doped region.

2. A display device according to claim 1, wherein the gate insulating film includes silicon oxide.

3. A display device according to claim 1, wherein the second interlayer insulating film includes silicon oxide.

4. A display device according to claim 1, wherein the pixel electrode includes ITO.

5. A display device according to claim 1, wherein the display device is a liquid crystal display.

6. A display device according to claim 1, wherein the silicon nitride film is thicker than the silicon oxide film.

7. A display device according to claim 1, wherein the impurity is phosphorus.

8. A display device comprising:
   an active layer and a gate electrode formed over the active layer with a gate insulating film interposed therebetween, wherein the active layer contains a pair of impurity regions and a lightly doped region which contains an impurity concentration less than that of the pair of impurity regions;
   a first interlayer insulating film formed over the gate electrode, wherein the first interlayer insulating film contains silicon oxide film and silicon nitride film;
   a wiring formed over the first interlayer insulating film and electrically connected to one of the pair of impurity regions through a first contact hole formed in the first interlayer insulating film, wherein the wiring includes a first layer and a second layer with an aluminum layer interposed therebetween;
   a second interlayer insulating film formed over the wiring and the first interlayer insulating film; and a pixel electrode formed over the second interlayer insulating film and electrically connected to the wiring through a second contact hole formed in the second interlayer insulating film, wherein a perpendicular line extending from a center of the first contact hole and a perpendicular line extending from a center of the second contact hole are not aligned with each other, wherein the one of the pair of impurity regions is wider than the other one of the pair of impurity regions, and wherein the gate electrode overlaps the lightly doped region.

9. A display device according to claim 8, wherein the gate insulating film includes silicon oxide.

10. A display device according to claim 8, wherein the second interlayer insulating film includes silicon oxide.

11. A display device according to claim 8, wherein the pixel electrode includes ITO.

12. A display device according to claim 8, wherein the first layer and the second layer include titanium.

13. A display device according to claim 8, wherein the display device is a liquid crystal display.

14. A display device according to claim 8, wherein the silicon nitride film is thicker than the silicon oxide film.

15. A display device according to claim 8, wherein the impurity is phosphorus.

16. A display device comprising:

an active layer and a gate electrode formed over the active layer with a gate insulating film interposed therebetween, wherein the active layer contains a pair of impurity regions and a lightly doped region which contains an impurity concentration less than that of the pair of impurity regions;

a first interlayer insulating film formed over the gate electrode, wherein the first interlayer insulating film contains silicon oxide film and silicon nitride film;

a wiring formed over the first interlayer insulating film and electrically connected to one of the pair of impurity regions through a first contact hole formed in the first interlayer insulating film;

a second interlayer insulating film formed over the wiring and the first interlayer insulating film; and a pixel electrode formed over the second interlayer insulating film and electrically connected to the wiring through a second contact hole formed in the second interlayer insulating film, wherein a perpendicular line extending from a center of the first contact hole and a perpendicular line extending from a center of the second contact hole are not aligned with each other, wherein the one of the pair of impurity regions is wider than the other one of the pair of impurity regions, wherein the center of the second contact hole overlaps the one of the pair of impurity regions, and wherein the gate electrode overlaps the lightly doped region.

17. A display device according to claim 16, wherein the gate insulating film includes silicon oxide.

18. A display device according to claim 16, wherein the second interlayer insulating film includes silicon oxide.

19. A display device according to claim 16, wherein the pixel electrode includes ITO.

20. A display device according to claim 16, wherein the display device is a liquid crystal display.

21. A display device according to claim 16, wherein the silicon nitride film is thicker than the silicon oxide film.

22. A display device according to claim 16, wherein the impurity is phosphorus.

23. A display device comprising:

an active layer and a gate electrode formed over the active layer with a gate insulating film interposed therebetween, wherein the active layer contains a pair of impurity regions and a lightly doped region which contains an impurity concentration less than that of the pair of impurity regions;

a first interlayer insulating film formed over the gate electrode, wherein the first interlayer insulating film contains silicon oxide film and silicon nitride film;

a wiring formed over the first interlayer insulating film and electrically connected to one of the pair of impurity regions through a first contact hole formed in the first interlayer insulating film, wherein the wiring includes a first layer and a second layer with an aluminum layer interposed therebetween;

a second interlayer insulating film formed over the wiring and the first interlayer insulating film; and a pixel electrode formed over the second interlayer insulating film and electrically connected to the wiring through a second contact hole formed in the second interlayer insulating film, wherein a perpendicular line extending from a center of the first contact hole and a perpendicular line extending from a center of the second contact hole are not aligned with each other, wherein the one of the pair of impurity regions is wider than the other one of the pair of impurity regions, wherein the center of the second hole overlaps the one of the pair of impurity regions, and wherein the gate electrode overlaps the lightly doped region.

24. A display device according to claim 23, wherein the gate insulating film includes silicon oxide.

25. A display device according to claim 23, wherein the second interlayer insulating film includes silicon oxide.

26. A display device according to claim 23, wherein the pixel electrode includes ITO.

27. A display device according to claim 23, wherein the first layer and the second layer include titanium.

28. A display device according to claim 23, wherein the display device is a liquid crystal display.

29. A display device according to claim 23, wherein the silicon nitride film is thicker than the silicon oxide film.

30. A display device according to claim 23, wherein the impurity is phosphorus.

* * * * *